US012249570B2

(12) United States Patent
Yoshihara

(10) Patent No.: US 12,249,570 B2
(45) Date of Patent: Mar. 11, 2025

(54) SEMICONDUCTOR DEVICE

(71) Applicant: ROHM CO., LTD., Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 576 days.

(21) Appl. No.: 17/479,100

(22) Filed: Sep. 20, 2021

(65) Prior Publication Data

US 2022/0102264 A1 Mar. 31, 2022

(30) Foreign Application Priority Data

Sep. 25, 2020 (JP) ................................. 2020-160625

(51) Int. Cl.
*H01L 23/498* (2006.01)
*H01L 23/31* (2006.01)
*H01L 23/367* (2006.01)

(52) U.S. Cl.
CPC .... *H01L 23/49844* (2013.01); *H01L 23/3121* (2013.01); *H01L 23/367* (2013.01); *H01L 23/49811* (2013.01)

(58) Field of Classification Search
None
See application file for complete search history.

(56) References Cited

U.S. PATENT DOCUMENTS

2012/0256194 A1* 10/2012 Yoshihara ............. H01L 23/645
257/77

FOREIGN PATENT DOCUMENTS

DE 212018000087 U1 * 6/2019 ....... H01L 23/49524
JP 2009-158787 A 7/2009
WO 2019239771 A1 12/2019

OTHER PUBLICATIONS

Office Action issued in corresponding Japanese Application No. 2020-160625, dated May 14, 2024, 19 pages provided, with English translation.

* cited by examiner

*Primary Examiner* — Michelle Mandala
*Assistant Examiner* — Jordan M Klein
(74) *Attorney, Agent, or Firm* — HSML P. C.

(57) ABSTRACT

A semiconductor device includes: a first wiring layer having a first main surface facing a thickness direction; a second wiring layer having a second main surface facing the same side as the first main surface and located away from the first wiring layer; a first semiconductor element having a first main surface electrode and bonded to the first main surface; a second semiconductor element having a second main surface electrode and bonded to the second main surface; a first terminal electrically connected to the second main surface electrode; a first conductive member bonded to the first main surface electrode and the second main surface; and a second conductive member bonded to the second main surface electrode and the first terminal, wherein the first terminal is located away from the first wiring layer in the thickness direction, and the second conductive member overlaps the first wiring layer in the thickness direction.

20 Claims, 15 Drawing Sheets

SEMICONDUCTOR DEVICE

CROSS-REFERENCE TO RELATED APPLICATION

This application is based upon and claims the benefit of priority from Japanese Patent Application No. 2020-160625, filed on Sep. 25, 2020, the entire contents of which are incorporated herein by reference.

TECHNICAL FIELD

The present disclosure relates to a semiconductor device including a plurality of semiconductor elements.

BACKGROUND

In the related art, semiconductor devices mounted with a plurality of semiconductor elements having a switching function, such as MOSFETs and IGBTs, are widely known. Such a semiconductor device is mainly used for power conversion. In an example of the semiconductor device, a plurality of wiring layers is arranged on a surface of an insulating substrate, and a plurality of wiring relay regions is also arranged on the surface of the insulating substrate. Each of the plurality of wiring relay regions, together with the plurality of wiring layers, forms a conduction path of the semiconductor device.

In the semiconductor device as described above, dimensions of the semiconductor device in a plan view tend to increase with the arrangement of the plurality of wiring relay regions. However, in recent years, since there has been an increasing demand for further miniaturization of the semiconductor device, it is desired to improve the semiconductor device in order to meet such a demand.

SUMMARY

Some embodiments of the present disclosure provide a semiconductor device capable of being miniaturized.

A semiconductor device provided by the present disclosure includes: a first wiring layer having a first main surface facing a thickness direction; a second wiring layer having a second main surface facing the same side as the first main surface in the thickness direction and being located away from the first wiring layer in a first direction orthogonal to the thickness direction; a first semiconductor element having a first main surface electrode provided on a side facing the first main surface in the thickness direction, the first semiconductor element being bonded to the first main surface; a second semiconductor element having a second main surface electrode provided on a side facing the second main surface in the thickness direction, the second semiconductor element being bonded to the second main surface; a first terminal electrically connected to the second main surface electrode; a first conductive member bonded to the first main surface electrode and the second main surface; and a second conductive member bonded to the second main surface electrode and the first terminal, wherein the first terminal is located away from the first wiring layer on the side facing the first main surface in the thickness direction, and wherein the second conductive member overlaps the first wiring layer when viewed along the thickness direction.

In some embodiments, the first terminal may overlap the first wiring layer when viewed along the thickness direction.

In some embodiments, the semiconductor device may further include a substrate having a third main surface facing the same side as the first main surface and the second main surface in the thickness direction, wherein the first wiring layer and the second wiring layer are bonded to the third main surface.

In some embodiments, a thickness of each of the first wiring layer and the second wiring layer may be larger than a thickness of the substrate.

In some embodiments, the first terminal may have a terminal portion located outside the substrate when viewed along the thickness direction, and a base portion which is connected to the terminal portion and overlaps the substrate when viewed along the thickness direction, and the base portion may be located on a side opposite to the second wiring layer with respect to the first semiconductor element in the first direction.

In some embodiments, the base portion may overlap the first wiring layer when viewed along the thickness direction, the second conductive member may be bonded to the base portion, and the second conductive member may overlap the first semiconductor element when viewed along the thickness direction.

In some embodiments, the second conductive member may overlap the first conductive member when viewed along the thickness direction.

In some embodiments, the first terminal may have an extension portion that is connected to the base portion and overlaps the first wiring layer when viewed along the thickness direction, the extension portion may extend along the first direction toward the second semiconductor element when viewed along the thickness direction, and the second conductive member may be bonded to the extension portion.

In some embodiments, at least one of both ends of the extension portion in the first direction may be located outside the first wiring layer when viewed along the thickness direction.

In some embodiments, a tip of the extension portion in the first direction may overlap a region of the substrate sandwiched between the first wiring layer and the second wiring layer when viewed along the thickness direction.

In some embodiments, when viewed along the thickness direction, the first semiconductor element may have a pair of edges, which are located apart from each other in a second direction orthogonal to both the thickness direction and the first direction and extend along the first direction, and an extension line of any one of the paired edges may overlap the second semiconductor element when viewed along the thickness direction.

In some embodiments, the extension portion may overlap any one of the paired edges when viewed along the thickness direction.

In some embodiments, the first conductive member may be located away from the extension portion and the second conductive member when viewed along the thickness direction.

In some embodiments, the first semiconductor element may have a first back surface electrode located on an opposite side to the first main surface electrode in the thickness direction and may be electrically connected to the first wiring layer, the first back surface electrode may be bonded to the first main surface, the second semiconductor element may have a second back surface electrode located on an opposite side to the second main surface electrode in the thickness direction and may be electrically connected to the second wiring layer, and the second back electrode may be bonded to the second main surface.

In some embodiments, the semiconductor device may further include a second terminal electrically connected to the first wiring layer, wherein the second terminal is located away from the first terminal when viewed along the thickness direction, and wherein both the terminal portion and the second terminal are located on one side in the first direction with respect to the first wiring layer and the second wiring layer.

In some embodiments, the semiconductor device may further include a sealing resin configured to cover the first wiring layer, the second wiring layer, the first semiconductor element, the second semiconductor element, the first conductive member and the second conductive member, and a portion of each of the first terminal and the second terminal, wherein the third main surface is in contact with the sealing resin.

In some embodiments, the substrate may have a back surface facing a side opposite to the third main surface in the thickness direction, and the semiconductor device may further include a heat dissipation layer bonded to the back surface and exposed from the sealing resin, wherein the back surface is in contact with the sealing resin.

Other features and advantages of the present disclosure will become more apparent with the detailed description given below based on the accompanying drawings.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be now described in detail with reference to the accompanying drawings. Each of the drawings is schematically drawn. In addition, each of the drawings may include omitted and exaggerated portions.

First Embodiment

Figure 1:
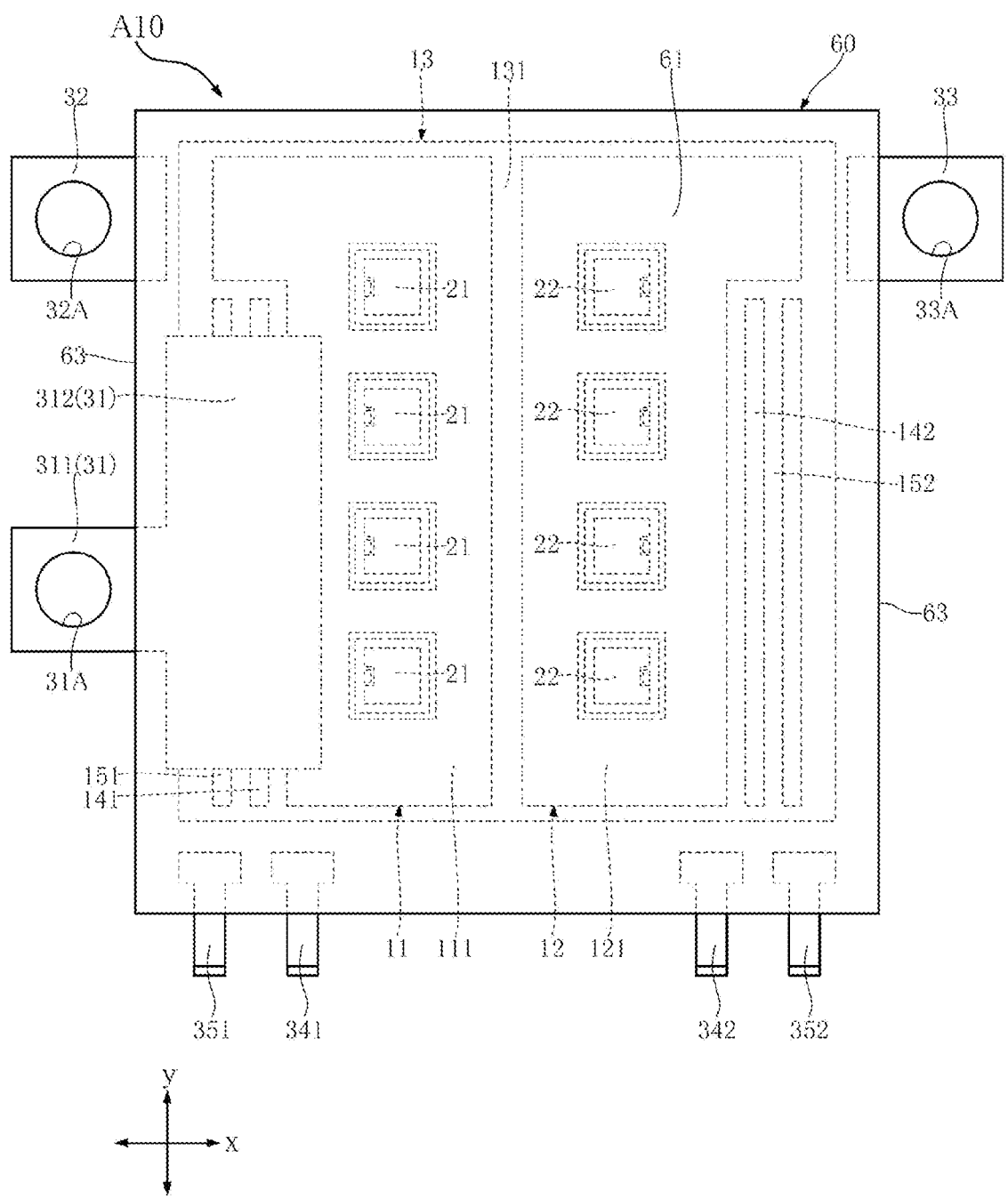
FIG. 1 is a plan view of a semiconductor device according to a first embodiment of the present disclosure.
Figure 2:
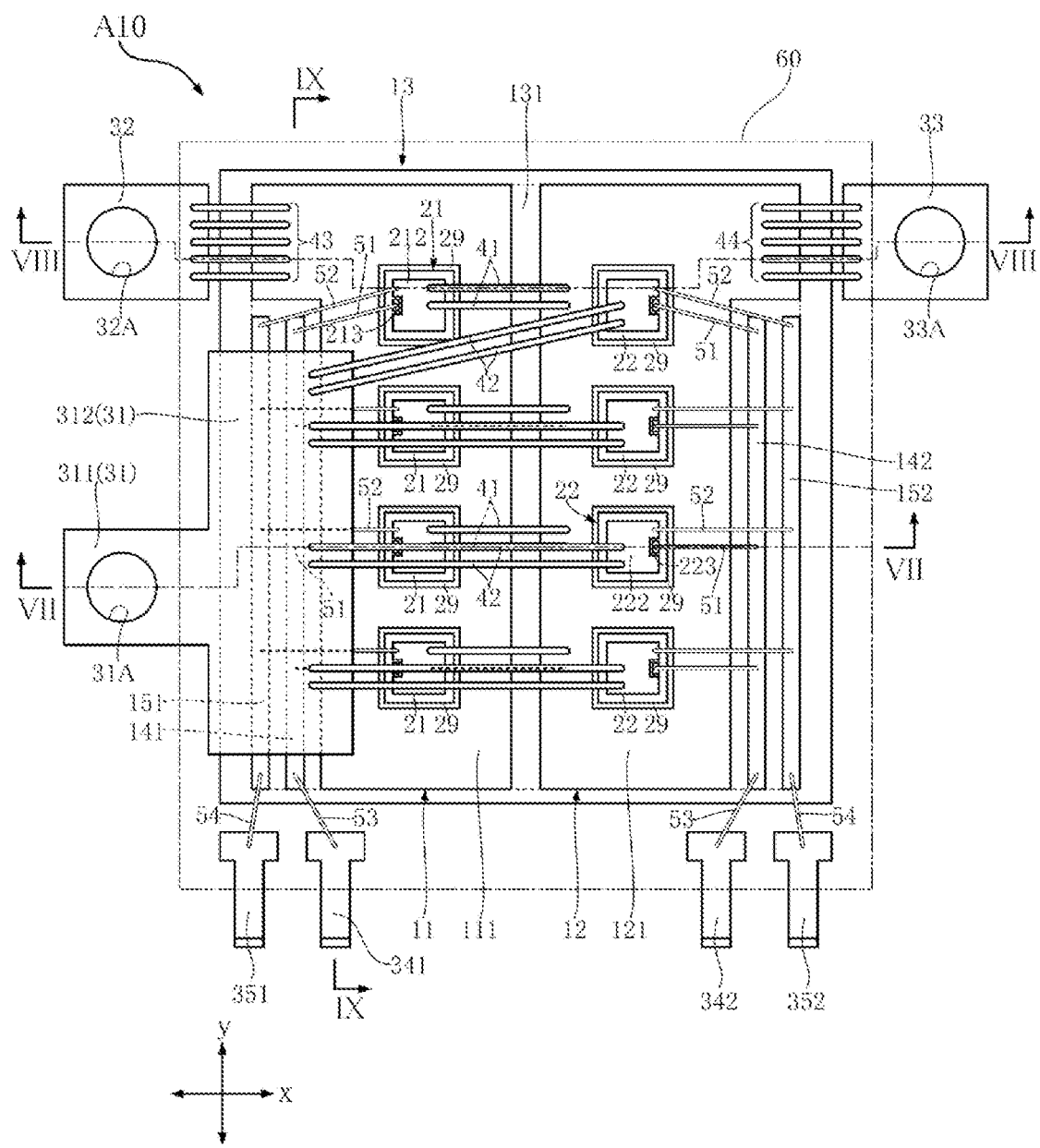
FIG. 2 is a plan view corresponding to FIG. 1 and is transparent to a sealing resin.
Figure 3:
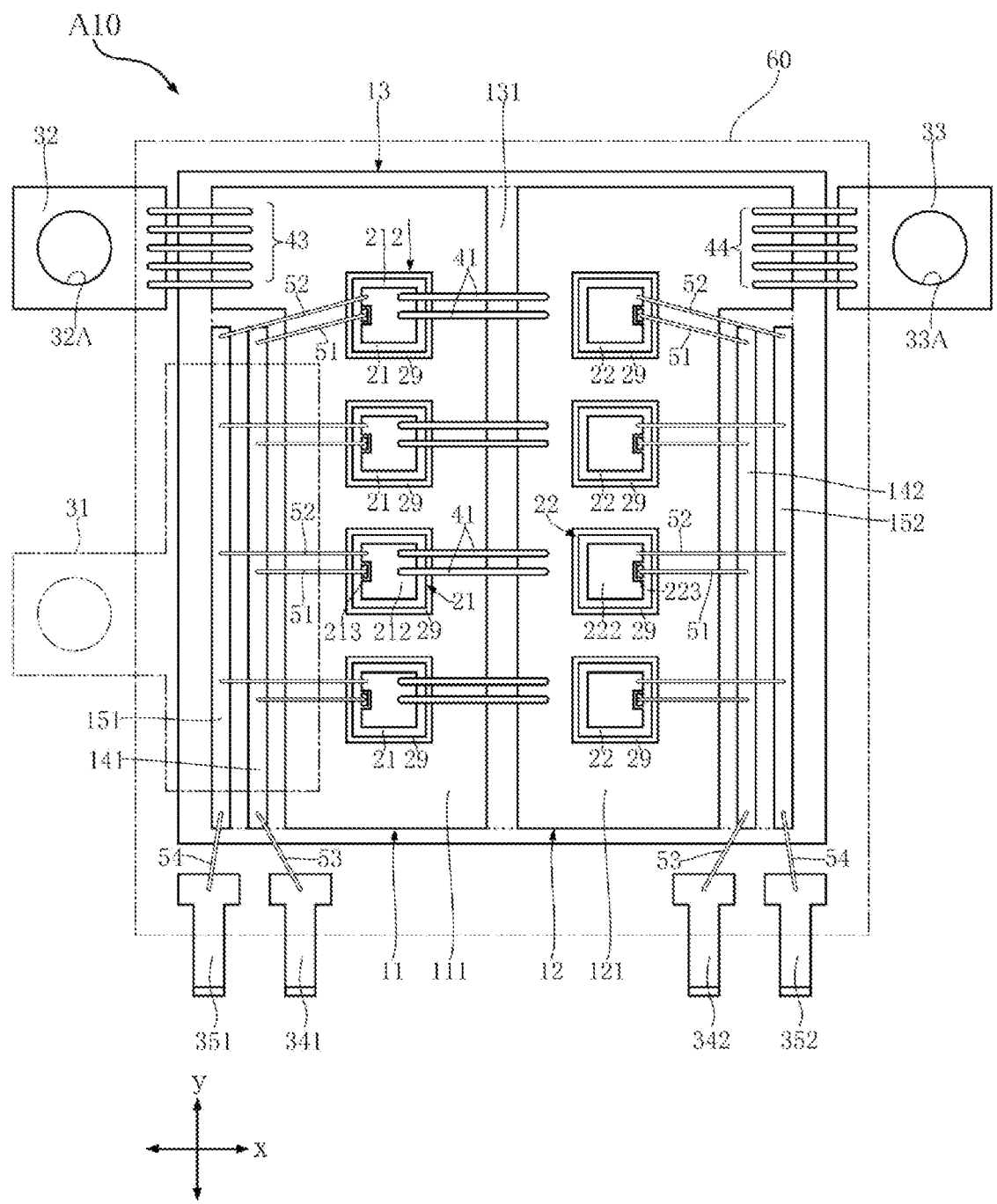
FIG. 3 is a plan view corresponding to FIG. 2, and is further transparent to a first terminal and a plurality of second conductive members.

A semiconductor device A10 according to a first embodiment of the present disclosure will be described with reference to FIGS. 1 to 12. The semiconductor device A10 includes a first wiring layer 11, a second wiring layer 12, a substrate 13, a plurality of first semiconductor elements 21, a plurality of second semiconductor elements 22, a first terminal 31, a second terminal 32, a third terminal 33, a plurality of first conductive members 41, a plurality of second conductive members 42, a third conductive member 43, a fourth conductive member 44, and a sealing resin 60. Further, the semiconductor device A10 includes a first gate wiring layer 141, a second gate wiring layer 142, a first detection wiring layer 151, a second detection wiring layer 152, a first gate terminal 341, a second gate terminal 342, a first detection terminal 351, a second detection terminal 352, a plurality of gate wires 51, a plurality of detection wires 52, a pair of first wires 53, and a pair of second wires 54. Here, FIG. 2 is transparent to the sealing resin 60 for the sake of convenience of understanding. FIG. 3 is further transparent to the first terminal 31 and the plurality of second conductive members 42 with respect to FIG. 2 for the sake of convenience of understanding. In FIGS. 2 and 3, the transparent sealing resin 60 is indicated by an imaginary line (two-dot chain line). In FIG. 3, the transparent first terminal 31 is indicated by an imaginary line. In FIG. 2, line VII-VII and line VIII-VIII line are respectively indicated by one-dot chain lines.

In the description of the semiconductor device A10, for the sake of convenience, a thickness direction of each of the first wiring layer 11 and the second wiring layer 12 is referred to as a "thickness direction z." A direction orthogonal to the thickness direction z is referred to a "first direction x." A direction orthogonal to both the thickness direction z and the first direction x is referred to as a "second direction y."

The semiconductor device A10 converts a DC power supply voltage applied to the first terminal 31 and the second terminal 32 into AC power by the plurality of first semiconductor elements 21 and the plurality of second semiconductor elements 22. The converted AC power is input from the third terminal 33 to a power supply target such as a motor. The semiconductor device A10 forms a part of a power conversion circuit such as an inverter.

As shown in FIGS. 2, 3, 7, and 8, the first wiring layer 11 is mounted with the plurality of first semiconductor elements 21. The first wiring layer 11 is formed of a material containing copper (Cu) or a copper alloy. When viewed along the thickness direction z, the first wiring layer 11 has a rectangular shape, which has long sides along the second direction y and a cutout portion on a side where the second terminal 32 is located in the first direction x. The first wiring layer 11 has a first main surface 111 facing the thickness direction z. When viewed along the thickness direction z, the first wiring layer 11 is located inward of a peripheral edge of the substrate 13.

As shown in FIGS. 2, 3, 7, and 8, the second wiring layer 12 is mounted with the plurality of second semiconductor elements 22. The second wiring layer 12 is formed of a material containing copper or a copper alloy. The second wiring layer 12 is located away from the first wiring layer 11 in the first direction x. When viewed along the thickness direction z, the second wiring layer 12 has a rectangular shape, which has long sides along the second direction y and a cutout portion on a side where the third terminal 33 is located in the first direction x. The second wiring layer 12 has a second main surface 121 facing the same side as the first main surface 111 of the first wiring layer 11 in the thickness direction z. When viewed along the thickness direction z, the second wiring layer 12 is located inward of the peripheral edge of the substrate 13.

Figure 7:
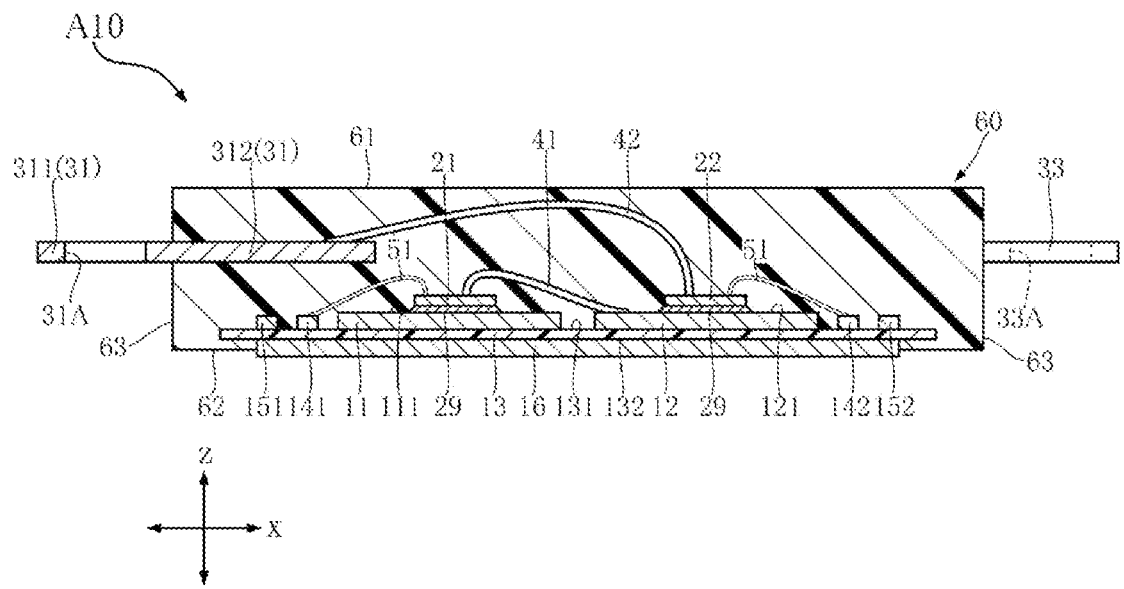
FIG. 7 is a cross-sectional view taken along line VII-VII in FIG. 2.
Figure 8:
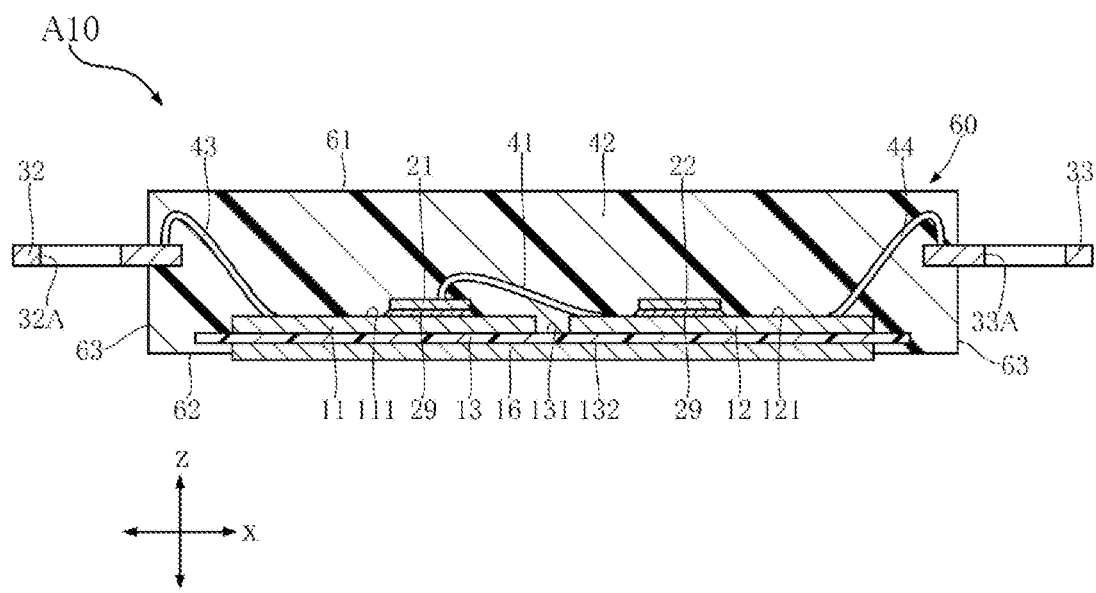
FIG. 8 is a cross-sectional view taken along line VIII-VIII in FIG. 2.
Figure 9:
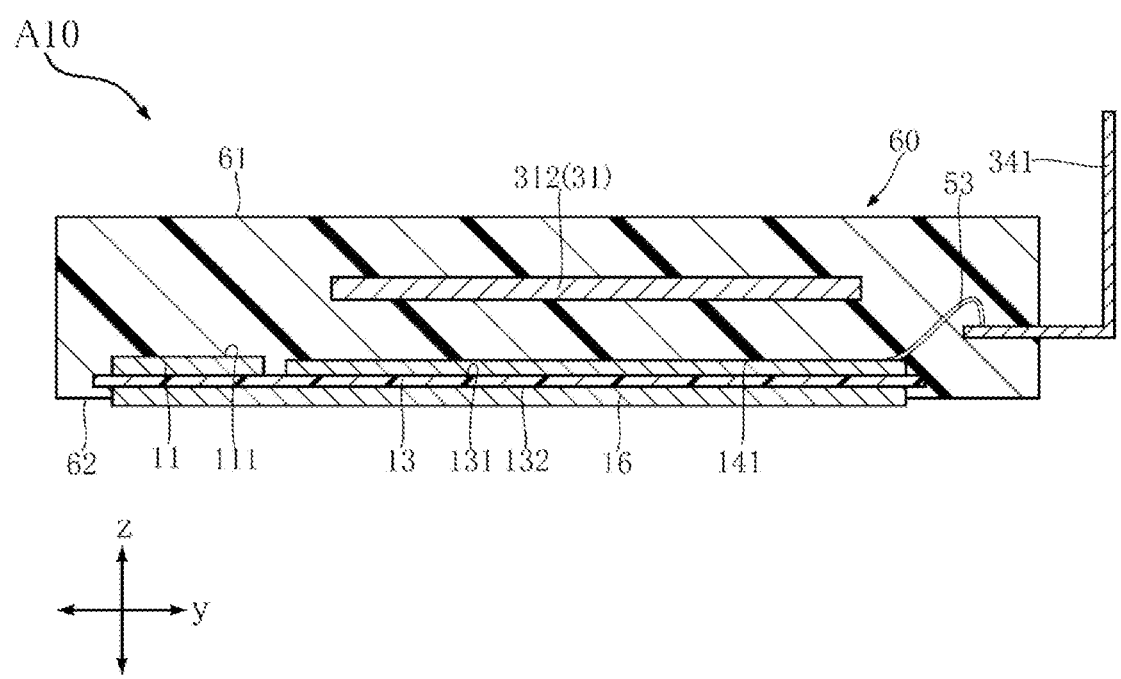
FIG. 9 is a cross-sectional view taken along line IX-IX in FIG. 2.

As shown in FIG. 7, the substrate 13 supports the first wiring layer 11, the second wiring layer 12, the first gate wiring layer 141, the second gate wiring layer 142, the first detection wiring layer 151, the second detection wiring layer 152, a heat dissipation layer 16, and the sealing resin 60. The substrate 13 has electrical insulation. The substrate 13 is, for example, a ceramics substrate. An example of the ceramics may include aluminum nitride (AlN). The material used for the substrate 13 may have relatively large thermal conductivity. The substrate 13 has a third main surface 131 and a back surface 132. The third main surface 131 faces the same side as the first main surface 111 of the first wiring layer 11 and the second main surface 121 of the second wiring layer 12 in the thickness direction z. The first wiring layer 11 and the second wiring layer 12 are bonded to the third main surface 131. The back surface 132 faces a side opposite to the third main surface 131 in the thickness direction z. As shown in FIGS. 7 to 9, each of the third main surface 131 and the back surface 132 is in contact with the sealing resin 60.

Figure 4:
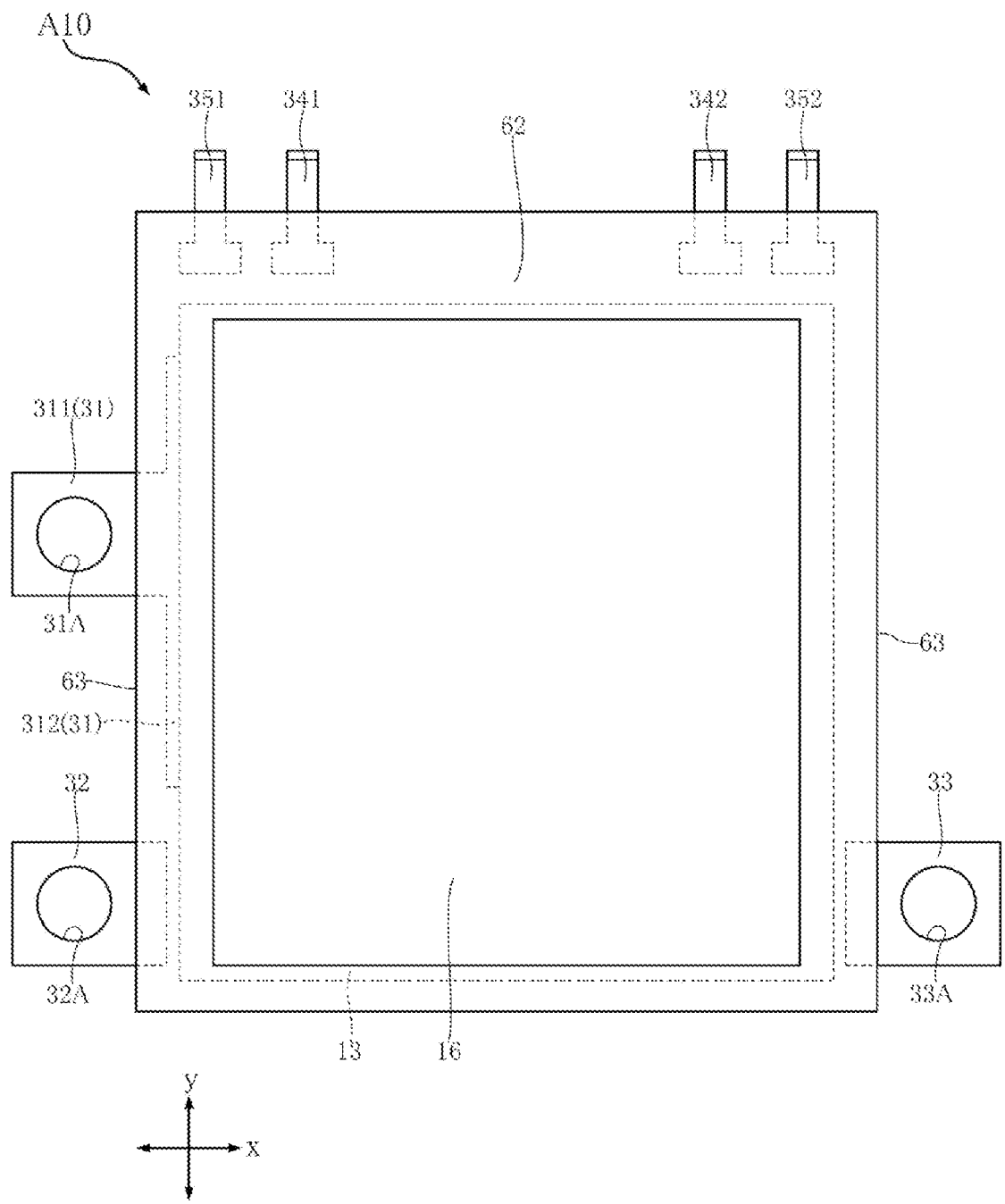
FIG. 4 is a bottom view of the semiconductor device shown in FIG. 1.

As shown in FIGS. 7 to 9, the heat dissipation layer 16 is bonded to the back surface 132 of the substrate 13. The heat dissipation layer 16 is formed of a material containing copper or a copper alloy. As shown in FIG. 4, when viewed along the thickness direction z, the heat dissipation layer 16 is located inward of the peripheral edge of the substrate 13. When viewed along the thickness direction z, an area of the heat dissipation layer 16 is larger than an area of each of the first wiring layer 11 and the second wiring layer 12. The heat dissipation layer 16 is exposed from a bottom surface 62 of the sealing resin 60, which will be described later.

Figure 11:
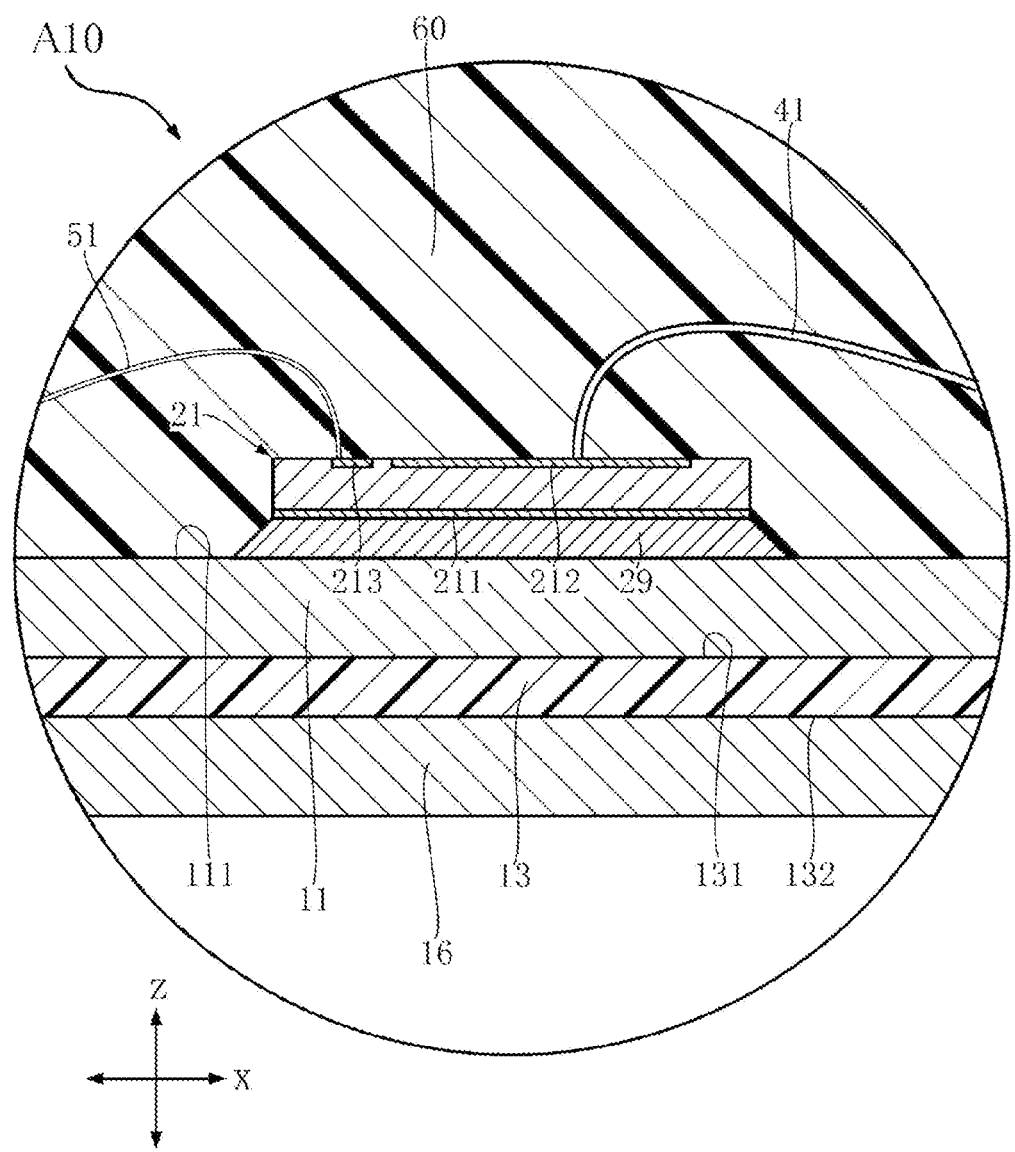
FIG. 11 is a partially enlarged view of FIG. 7.
Figure 12:
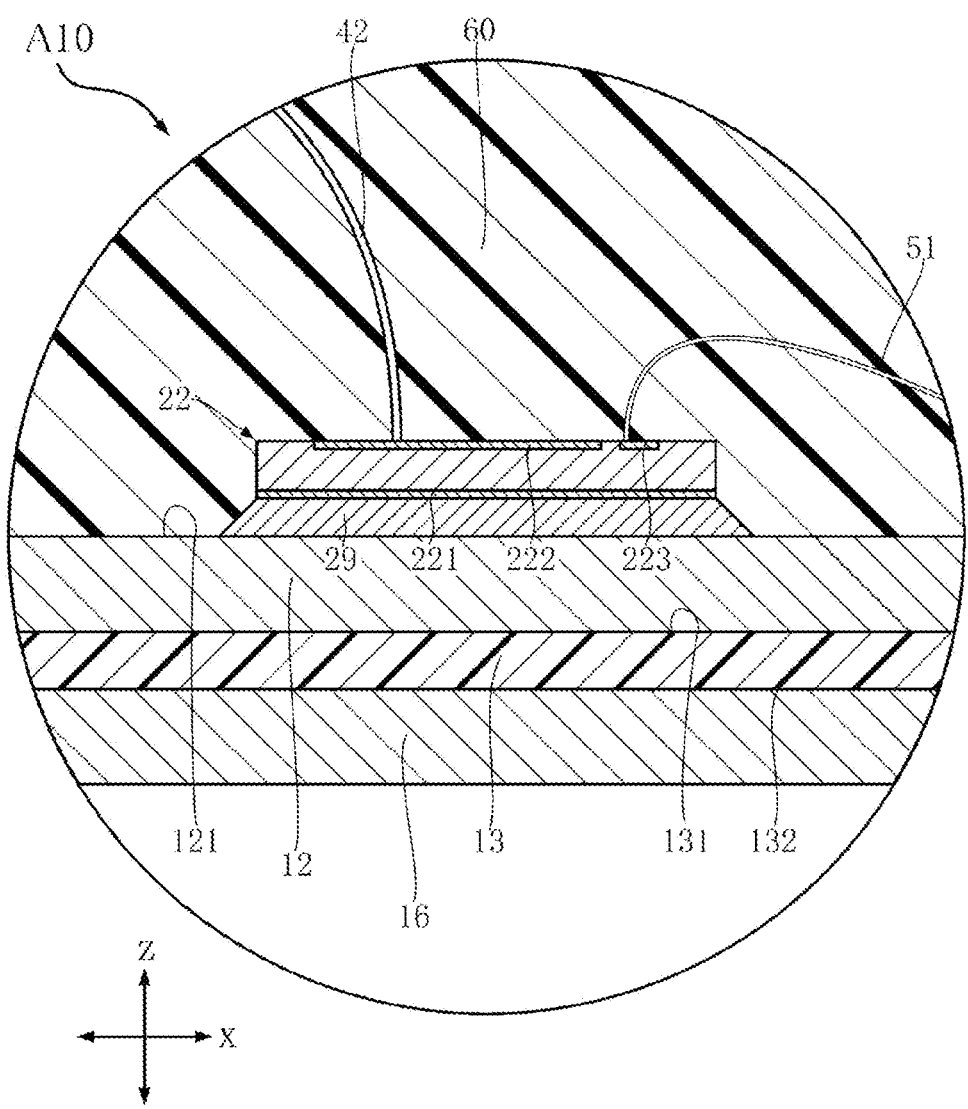
FIG. 12 is a partially enlarged view of FIG. 7.

As shown in FIGS. 11 and 12, a thickness of each of the first wiring layer 11, the second wiring layer 12, and the heat dissipation layer 16 is larger than a thickness of the substrate 13.

As shown in FIGS. 2, 3, 7, and 8, the plurality of first semiconductor elements 21 is bonded to the first main surface 111 of the first wiring layer 11. The first semiconductor elements 21 are all the same element. Each of the plurality of first semiconductor elements 21 is, for example, a MOSFET (Metal-Oxide-Semiconductor Field-Effect Transistor). Alternatively, each of the plurality of first semiconductor elements 21 may be a field effect transistor including a MISFET (Metal-Insulator-Semiconductor Field-Effect Transistor) or a bipolar transistor such as an IGBT (Insulated Gate Bipolar Transistor). Each of the plurality of first semiconductor elements 21 includes a compound semiconductor substrate. The composition of the compound semiconductor substrate includes silicon carbide (SiC). Alternatively, the composition of the compound semiconductor substrate may include gallium nitride (GaN). Hereinafter, in the description of the semiconductor device A10, a case where each of the plurality of first semiconductor elements 21 is of an n-channel type and is a MOSFET having a vertical structure will be described. The plurality of first semiconductor elements 21 is arranged along the second direction y.

Figure 10:
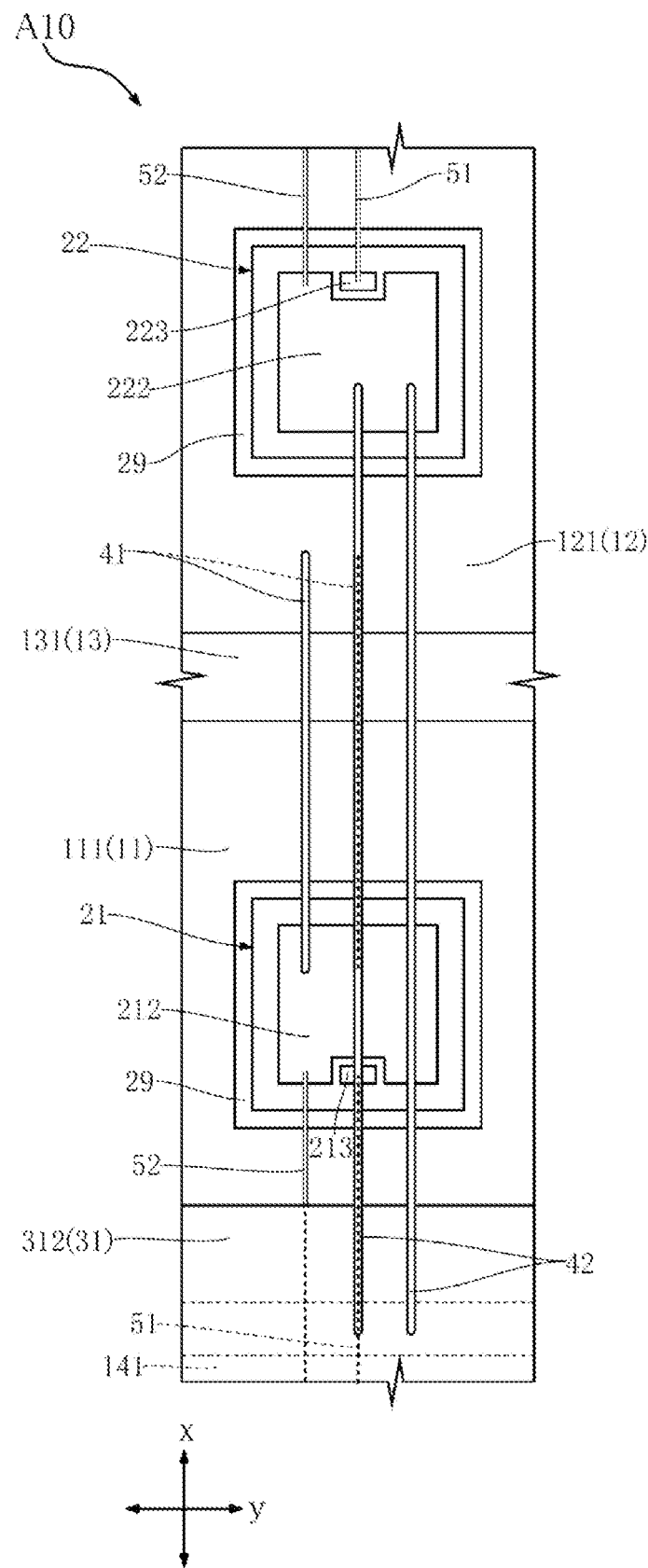
FIG. 10 is a partially enlarged view of FIG. 2.

As shown in FIGS. 10 and 11, each of the plurality of first semiconductor elements 21 has a first back surface electrode 211, a first main surface electrode 212, and a first gate electrode 213. In each of the plurality of first semiconductor elements 21, the first back surface electrode 211 is provided so as to face the first main surface 111 of the first wiring layer 11. A current corresponding to electric power converted by any one of the plurality of first semiconductor elements 21 flows through the first back surface electrode 211. That is, the first back surface electrode 211 corresponds to a drain electrode of the first semiconductor element 21. The first back surface electrode 211 of each of the plurality of first semiconductor elements 21 is bonded to the first main surface 111 by a bonding layer 29. The bonding layer 29 has conductivity. The bonding layer 29 is, for example, lead-free solder. Alternatively, the bonding layer 29 may be sintered metal containing silver (Ag) or the like. As a result, the first back surface electrode 211 of each of the plurality of first semiconductor elements 21 is electrically connected to the first wiring layer 11.

As shown in FIGS. 10 and 11, in each of the plurality of first semiconductor elements 21, the first main surface electrode 212 is provided on a side of the first wiring layer 11 facing the first main surface 111 in the thickness direction z. Therefore, in each of the plurality of first semiconductor elements 21, the first back surface electrode 211 and the first main surface electrode 212 are located on opposite sides to each other in the thickness direction z. A current corresponding to electric power converted by any one of the plurality of first semiconductor elements 21 flows through the first main surface electrode 212. That is, the first main surface electrode 212 corresponds to a source electrode of the first semiconductor element 21. The first main surface electrode 212 includes a plurality of metal plating layers. The first main surface electrode 212 includes a nickel (Ni) plating layer and a gold (Au) plating layer deposited on the nickel plating layer. Alternatively, the first main surface electrode 212 may include a nickel plating layer, a palladium (Pd) plating layer deposited on the nickel plating layer, and a gold plating layer deposited on the palladium plating layer.

As shown in FIGS. 10 and 11, in each of the plurality of first semiconductor elements 21, the first gate electrode 213 is provided on the same side as the first main surface electrode 212 in the thickness direction z. A gate voltage for driving any one of the plurality of first semiconductor elements 21 is applied to the first gate electrode 213. Each of the plurality of first semiconductor elements 21 converts a current corresponding to a voltage applied to the first back surface electrode 211 based on the gate voltage. As shown in FIG. 10, when viewed along the thickness direction z, an area of the first gate electrode 213 is smaller than an area of the first main surface electrode 212.

As shown in FIGS. 2, 3, 7, and 8, the plurality of second semiconductor elements 22 is bonded to the second main surface 121 of the second wiring layer 12. Each of the plurality of second semiconductor elements 22 is the same as any one of the plurality of first semiconductor elements 21. Therefore, in the semiconductor device A10, each of the plurality of second semiconductor elements 22 is a MOSFET. The plurality of second semiconductor elements 22 is arranged along the second direction y.

As shown in FIGS. 10 and 12, each of the plurality of second semiconductor elements 22 has a second back surface electrode 221, a second main surface electrode 222, and a second gate electrode 223. In each of the plurality of second semiconductor elements 22, the second back surface electrode 221 is provided so as to face the second main surface 121 of the second wiring layer 12. A current corresponding to electric power converted by any one of the plurality of second semiconductor elements 22 flows through the second back surface electrode 221. That is, the second back surface electrode 221 corresponds to a drain electrode of the second semiconductor element 22. The second back surface electrode 221 of each of the plurality of second semiconductor elements 22 is bonded to the second main surface 121 by the bonding layer 29. As a result, the second back surface electrode 221 of each of the plurality of second semiconductor elements 22 is electrically connected to the second wiring layer 12.

As shown in FIGS. 10 and 12, in each of the plurality of second semiconductor elements 22, the second main surface electrode 222 is provided on a side of the second wiring layer 12 facing the second main surface 121 in the thickness direction z. Therefore, in each of the plurality of second semiconductor elements 22, the second back surface electrode 221 and the second main surface electrode 222 are located on opposite sides to each other in the thickness direction z. A current corresponding to electric power converted by any one of the plurality of second semiconductor elements 22 flows through the second main surface electrode 222. That is, the second main surface electrode 222 corresponds to a source electrode of the second semiconductor element 22. The second main surface electrode 222 includes a plurality of metal plating layers like the first main surface electrode 212 of each of the plurality of first semiconductor elements 21. The plurality of metal plating layers has the same configuration as the plurality of metal plating layers included in the first main surface electrodes 212 of each of the plurality of first semiconductor elements 21.

As shown in FIGS. 10 and 12, in each of the plurality of second semiconductor elements 22, the second gate electrode 223 is provided on the same side as the second main surface electrode 222 in the thickness direction z. A gate voltage for driving any one of the plurality of second semiconductor elements 22 is applied to the second gate electrode 223. Each of the plurality of second semiconductor elements 22 converts a current corresponding to a voltage applied to the second back surface electrode 221 based on the gate voltage. As shown in FIG. 10, when viewed along the thickness direction z, an area of the second gate electrode 223 is smaller than an area of the second main surface electrode 222.

As shown in FIGS. 2, 3, and 7, the first gate wiring layer 141 is bonded to the third main surface 131 of the substrate 13. The first gate wiring layer 141 is electrically connected to the first gate electrode 213 of each of the plurality of first semiconductor elements 21. When viewed along the thickness direction z, the first gate wiring layer 141 is located at the cutout portion of the first wiring layer 11. The first gate wiring layer 141 extends along the second direction y. The first gate wiring layer 141 is formed of a material containing copper or a copper alloy.

Figure 5:
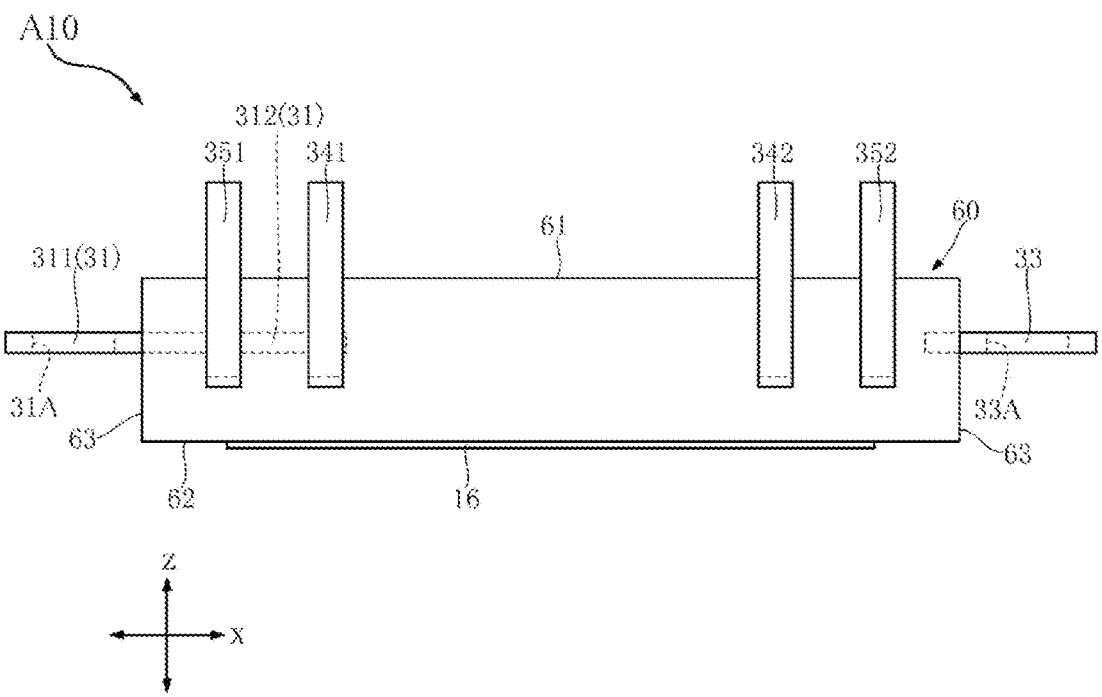
FIG. 5 is a front view of the semiconductor device shown in FIG. 1.
Figure 6:
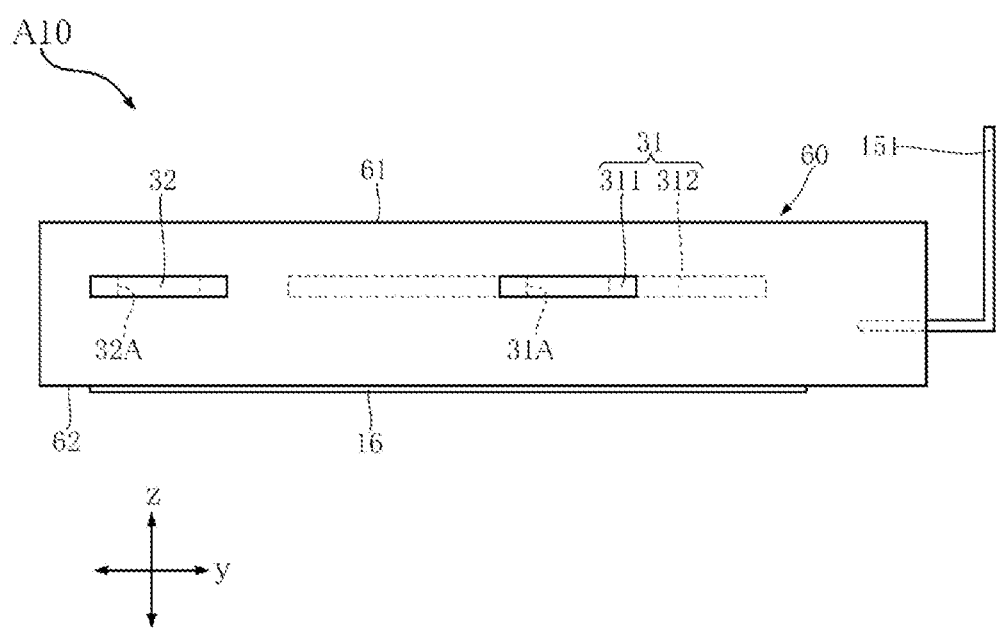
FIG. 6 is a left side view of the semiconductor device shown in FIG. 1.

As shown in FIGS. 2 and 3, the first gate terminal 341 is located on one side in the second direction y with respect to the substrate 13. The first gate terminal 341 is electrically connected to the first gate wiring layer 141. The first gate terminal 341 is a metal lead formed of a material containing copper or a copper alloy. As shown in FIGS. 1 and 9, a portion of the first gate terminal 341 is covered with the sealing resin 60. The first gate terminal 341 is L-shaped when viewed along the first direction x. As shown in FIG. 5, the first gate terminal 341 includes a portion that stands up in the thickness direction z. This portion is exposed from the sealing resin 60. The gate voltage for driving each of the plurality of first semiconductor elements 21 is applied to the first gate terminal 341.

As shown in FIGS. 2, 3 and 7, the second gate wiring layer 142 is bonded to the third main surface 131 of the substrate 13. The second gate wiring layer 142 is electrically connected to the second gate electrode 223 of each of the plurality of second semiconductor elements 22. When viewed along the thickness direction z, the second gate wiring layer 142 is located at the cutout portion of the second wiring layer 12. The second gate wiring layer 142 extends along the second direction y. The second gate wiring layer 142 is formed of a material containing copper or a copper alloy.

As shown in FIGS. 2 and 3, the second gate terminal 342 is located on the same side as the first gate terminal 341 in the second direction y with respect to the substrate 13. The second gate terminal 342 is electrically connected to the second gate wiring layer 142. The second gate terminal 342 is a metal lead formed of a material containing copper or a copper alloy. As shown in FIG. 1, a portion of the second gate terminal 342 is covered with the sealing resin 60. The second gate terminal 342 is L-shaped when viewed along the first direction x. As shown in FIG. 5, the second gate terminal 342 includes a portion that stands up in the thickness direction z. This portion is exposed from the sealing resin 60. The gate voltage for driving each of the plurality of second semiconductor elements 22 is applied to the second gate terminal 342.

As shown in FIGS. 2 and 3, the paired first wires 53 are bonded to the first gate terminal 341 and the first gate wiring layer 141 and to the second gate terminal 342 and the second gate wiring layer 142, respectively. As a result, the first gate terminal 341 is electrically connected to the first gate wiring layer 141, and the second gate terminal 342 is electrically connected to the second gate wiring layer 142. The composition of each of the paired first wires 53 includes gold. Alternatively, the composition of each of the paired first wires 53 may include copper or aluminum (Al).

As shown in FIGS. 2, 3, and 7, the first detection wiring layer 151 is bonded to the third main surface 131 of the substrate 13. The first detection wiring layer 151 is electrically connected to the first main surface electrode 212 of each of the plurality of first semiconductor elements 21. When viewed along the thickness direction z, the first detection wiring layer 151 is located at the cutout portion of the first wiring layer 11, and is located adjacent to the first gate wiring layer 141 in the first direction x. The first detection wiring layer 151 extends along the second direction y. The first detection wiring layer 151 is formed of a material containing copper or a copper alloy.

As shown in FIGS. 2 and 3, the first detection terminal 351 is located on the same side as the first gate terminal 341 in the second direction y with respect to the substrate 13, and is located adjacent to the first gate terminal 341 in the first direction x. The first detection terminal 351 is electrically connected to the first detection wiring layer 151. The first detection terminal 351 is a metal lead formed of a material containing copper or a copper alloy. As shown in FIG. 1, a portion of the first detection terminal 351 is covered with the sealing resin 60. The first detection terminal 351 is L-shaped when viewed along the first direction x. As shown in FIG. 5, the first detection terminal 351 includes a portion that stands up in the thickness direction z. This portion is exposed from the sealing resin 60. A voltage corresponding to a current flowing through the first main surface electrodes 212 of the plurality of first semiconductor elements 21 is applied to the first detection terminal 351.

As shown in FIGS. 2, 3, and 7, the second detection wiring layer 152 is bonded to the third main surface 131 of the substrate 13. The second detection wiring layer 152 is electrically connected to the second main surface electrode 222 of each of the plurality of second semiconductor elements 22. When viewed along the thickness direction z, the second detection wiring layer 152 is located at the cutout portion of the second wiring layer 12, and is located adjacent to the second gate wiring layer 142 in the first direction x. The second detection wiring layer 152 extends along the second direction y. The second detection wiring layer 152 is formed of a material containing copper or a copper alloy.

As shown in FIGS. 2 and 3, the second detection terminal 352 is located on the same side as the second gate terminal 342 in the second direction y with respect to the substrate 13, and is located adjacent to the second gate terminal 342 in the first direction x. The second detection terminal 352 is electrically connected to the second detection wiring layer 152. The second detection terminal 352 is a metal lead formed of a material containing copper or a copper alloy. As shown in FIG. 1, a portion of the second detection terminal 352 is covered with the sealing resin 60. The second detection terminal 352 is L-shaped when viewed along the first direction x. As shown in FIG. 5, the second detection terminal 352 includes a portion that stands up in the thickness direction z. This portion is exposed from the sealing resin 60. A voltage corresponding to a current flowing through the second main surface electrodes 222 of the plurality of second semiconductor elements 22 is applied to the second detection terminal 352.

As shown in FIGS. 2 and 3, the paired second wires 54 are bonded to the first detection terminal 351 and the first detection wiring layer 151 and to the second detection terminal 352 and the second detection wiring layer 152, respectively. As a result, the first detection terminal 351 is electrically connected to the first detection wiring layer 151, and the second detection terminal 352 is electrically connected to the second detection wiring layer 152. The composition of each of the paired second wires 54 includes gold. Alternatively, the composition of each of the paired second wires 54 may include copper or aluminum.

As shown in FIGS. 7 and 9, the first terminal 31 is located away from the first wiring layer 11 on a side facing the first main surface 111 in the thickness direction z. The first terminal 31 is electrically connected to the second main surface electrode 222 of each of the plurality of second semiconductor elements 22. The first terminal 31 is a metal plate formed of a material containing copper or a copper alloy. As shown in FIG. 2, the first terminal 31 overlaps the first wiring layer 11 when viewed along the thickness direction z.

As shown in FIGS. 1 to 7 (excluding FIG. 3), the first terminal 31 has a terminal portion 311 and a base portion 312. The terminal portion 311 is located outside the substrate 13 when viewed along the thickness direction z. The terminal portion 311 is located on one side in the first direction x with respect to the first wiring layer 11 and the second wiring layer 12. A portion of the terminal portion 311 is covered with the sealing resin 60. The terminal portion 311 has a first mounting hole 31A penetrating in the thickness direction z. The first mounting hole 31A is exposed from the sealing resin 60. The terminal portion 311 is an N terminal (negative electrode) to which a DC power supply voltage as the power conversion target is applied.

As shown in FIGS. 1, 2, 4, and 7, the base portion 312 is connected to the terminal portion 311 and overlaps the substrate 13 when viewed along the thickness direction z. The base portion 312 is located on a side opposite to the second wiring layer 12 with respect to the plurality of first semiconductor elements 21 in the first direction x. When viewed along the thickness direction z, the base portion 312 has a rectangular shape having long sides along the second direction y. The base portion 312 is covered with the sealing resin 60. In the semiconductor device A10, when viewed along the thickness direction z, the base portion 312 overlaps the first wiring layer 11, the first gate wiring layer 141, and the first detection wiring layer 151.

As shown in FIGS. 1 to 4, the second terminal 32 is located away from the first terminal 31 in the second direction y when viewed along the thickness direction z. The second terminal 32 is located on one side in the first direction x with respect to the first wiring layer 11 and the second wiring layer 12. That is, the second terminal 32 is located on the same side as the terminal portion 311 of the first terminal 31 in the first direction x with respect to the first wiring layer 11 and the second wiring layer 12. The second terminal 32 is electrically connected to the first wiring layer 11. The second terminal 32 is a metal plate formed of a material containing copper or a copper alloy. A portion of the second terminal 32 is covered with the sealing resin 60. The second terminal 32 has a second mounting hole 32A penetrating in the thickness direction z. The second mounting hole 32A is exposed from the sealing resin 60. The second terminal 32 is a P terminal (positive electrode) to which a DC power supply voltage as the power conversion target is applied.

As shown in FIGS. 2, 3, and 8, the third conductive member 43 is bonded to the second terminal 32 and the first main surface 111 of the first wiring layer 11. As a result, the second terminal 32 is electrically connected to the first wiring layer 11. Further, in the semiconductor device A10, the first back surface electrode 211 of each of the plurality of first semiconductor elements 21 is electrically connected to the second terminal 32 via the first wiring layer 11 and the third conductive member 43. In the semiconductor device A10, the third conductive member 43 is composed of a plurality of wires. The composition of each of the plurality of wires includes copper or aluminum. Alternatively, the third conductive member 43 may be a metal clip.

As shown in FIGS. 1 to 3, 7, and 8, the third terminal 33 is located on the other side in the first direction x with respect to the first wiring layer 11 and the second wiring layer 12. That is, the third terminal 33 is located on a side opposite to the terminal portion 311 of the first terminal 31 and the second terminal 32 in the first direction x with respect to the first wiring layer 11 and the second wiring layer 12. The third terminal 33 is electrically connected to the second wiring layer 12. The third terminal 33 is a metal plate formed of a material containing copper or a copper alloy. A portion of the third terminal 33 is covered with the sealing resin 60. The third terminal 33 has a third mounting hole 33A penetrating in the thickness direction z. The third mounting hole 33A is exposed from the sealing resin 60. AC power converted by the plurality of first semiconductor elements 21 and the plurality of second semiconductor elements 22 is output from the third terminal 33.

As shown in FIGS. 2, 3, and 8, the fourth conductive member 44 is bonded to the third terminal 33 and the second main surface 121 of the second wiring layer 12. As a result, the third terminal 33 is electrically connected to the second wiring layer 12. Further, in the semiconductor device A10, the second back surface electrode 221 of each of the plurality of second semiconductor elements 22 is electrically connected to the third terminal 33 via the second wiring layer 12 and the fourth conductive member 44. In the semiconductor device A10, the fourth conductive member 44 is composed of a plurality of wires. The composition of each of the plurality of wires includes copper or aluminum. Alternatively, the fourth conductive member 44 may be a metal clip.

As shown in FIGS. 2, 3, 10, and 11, each of the plurality of first conductive members 41 is bonded to the first main surface electrode 212 of any one of the plurality of first semiconductor elements 21, and the second main surface 121 of the second wiring layer 12. As a result, the first main surface electrode 212 of each of the plurality of first semiconductor elements 21 is electrically connected to the second wiring layer 12. Each of the plurality of first conductive members 41 extends along the first direction x when viewed along the thickness direction z. In the semiconductor device A10, each of the plurality of first conductive members 41 is composed of a plurality of wires. The composition of each of the plurality of wires includes copper or aluminum. Alternatively, each of the plurality of first conductive members 41 may be a metal lead.

As shown in FIGS. 2, 3, 10, and 12, each of the plurality of second conductive members 42 is bonded to the second main surface electrode 222 of any one of the plurality of second semiconductor elements 22, and the first terminal 31. In the semiconductor device A10, each of the plurality of second conductive members 42 is bonded to the base portion 312 of the first terminal 31. As a result, the second main surface electrode 222 of each of the plurality of second semiconductor elements 22 is electrically connected to the first terminal 31. Each of the plurality of second conductive members 42 overlaps the first wiring layer 11 when viewed along the thickness direction z. In the semiconductor device A10, when viewed along the thickness direction z, each of the plurality of second conductive members 42 extends along the first direction x, and overlaps any one of the plurality of first semiconductor elements 21 and any one of the plurality of first conductive members 41. In the semiconductor device A10, each of the plurality of second conductive members 42 is composed of a plurality of wires. The composition of each of the plurality of wires includes copper or aluminum. Alternatively, each of the plurality of second conductive members 42 may be a metal lead.

As shown in FIGS. 2, 3, and 10, each of some of the plurality of gate wires 51 is bonded to the first gate electrode 213 of any one of the plurality of first semiconductor elements 21, and the first gate wiring layer 141. As a result, the first gate electrode 213 of each of the plurality of first semiconductor elements 21 is electrically connected to the first gate wiring layer 141, and is also electrically connected to the first gate terminal 341 via one of the paired first wires 53. Further, as shown in FIGS. 2, 3, and 10, each of the remaining gate wires 51 is bonded to the second gate electrode 223 of any one of the plurality of second semiconductor elements 22, and the second gate wiring layer 142. As a result, the second gate electrode 223 of each of the plurality of second semiconductor elements 22 is electrically connected to the second gate wiring layer 142, and is also electrically connected to the second gate terminal 342 via the other of the paired first wires 53. The composition of each of the plurality of gate wires 51 includes gold. Alternatively, the composition of each of the plurality of gate wires 51 may include aluminum or copper.

As shown in FIGS. 2, 3, and 10, each of some of the plurality of detection wires 52 is bonded to the first main surface electrode 212 of any one of the plurality of first semiconductor elements 21, and the first detection wiring layer 151. As a result, the first main surface electrode 212 of each of the plurality of first semiconductor elements 21 is electrically connected to the first detection wiring layer 151, and is also electrically connected to the first detection terminal 351 via one of the paired second wires 54. Further, as shown in FIGS. 2, 3, and 10, each of the remaining detection wires 52 is bonded to the second main surface electrode 222 of any one of the plurality of second semiconductor elements 22, and the second detection wiring layer 152. As a result, the second main surface electrode 222 of each of the plurality of second semiconductor elements 22 is electrically connected to the second detection wiring layer 152, and is also electrically connected to the second detection terminal 352 via the other of the paired second wires 54. The composition of each of the plurality of detection wires 52 includes gold. Alternatively, the composition of each of the plurality of detection wires 52 may include aluminum or copper.

As shown in FIGS. 1 and 7 to 9, the sealing resin 60 covers the first wiring layer 11, the second wiring layer 12, the substrate 13, the first gate wiring layer 141, the second gate wiring layer 142, the first detection wiring layer 151, the second detection wiring layer 152, the plurality of first semiconductor elements 21, the plurality of second semiconductor elements 22, the plurality of first conductive members 41, the plurality of second conductive members 42, the third conductive member 43, and the fourth conductive member 44. Further, the sealing resin 60 covers a portion of each of the heat dissipation layer 16, the first terminal 31, the second terminal 32, the third terminal 33, the first gate terminal 341, the second gate terminal 342, the first detection terminal 351, and the second detection terminal 352. The sealing resin 60 has electrical insulation. The sealing resin 60 is formed of a material containing, for example, a black epoxy resin.

As shown in FIGS. 1, 4, and 5 to 9, the sealing resin 60 has a top surface 61, a bottom surface 62, and a pair of side surfaces 63. The top surface 61 faces the same side as the third main surface 131 of the substrate 13 in the thickness direction z. An area of the top surface 61 is larger than an area of the third main surface 131. The bottom surface 62 faces a side opposite to the top surface 61 in the thickness direction z. An exposed portion of the heat dissipation layer 16 from the sealing resin 60 protrudes from the bottom surface 62 in the thickness direction z. The paired side surfaces 63 are located apart from each other in the first direction x and are connected to the top surface 61 and the bottom surface 62. The terminal portion 311 of the first terminal 31 and the second terminal 32 are exposed from one of the paired side surfaces 63. The third terminal 33 is exposed from the other of the paired side surfaces 63.

Next, operative effects of the semiconductor device A10 will be described.

The semiconductor device A10 includes the first wiring layer 11 having the first main surface 111, the second wiring layer 12 having the second main surface 121, the first semiconductor element 21 having the first main surface electrode 212 and bonded to the first main surface 111, and the second semiconductor element 22 having the second main surface electrode 222 and bonded to the second main surface 121. Further, the semiconductor device A10 includes the first terminal 31 electrically connected to the second main surface electrode 222, the first conductive member 41 bonded to the first main surface electrode 212 and the second main surface 121, and the second conductive member 42 bonded to the second main surface electrode 222 and the first terminal 31. The first terminal 31 is located away from the first wiring layer 11 on the side facing the first main surface 111 in the thickness direction z. The second conductive member 42 overlaps the first wiring layer 11 when viewed along the thickness direction z. As a result, in the semiconductor device A10, the first terminal 31 and the second conductive member 42 are arranged on the side facing the first main surface 111 in the thickness direction z with respect to the first wiring layer 11. Therefore, the dimensions of the semiconductor device A10 in a plan view (from the viewpoint along the thickness direction z) can be reduced. Therefore, according to the semiconductor device A10, it is possible to reduce the size of the device.

The first terminal 31 (the base portion 312 in the semiconductor device A10) overlaps the first wiring layer 11 when viewed along the thickness direction z. As a result, mutual inductance caused by the first wiring layer 11 and the first terminal 31 is generated in the semiconductor device A10. Due to the mutual inductance, the inductance applied to the first wiring layer 11 is reduced. Therefore, power loss in the first wiring layer 11 can be suppressed.

The second conductive member 42 overlaps the first semiconductor element 21 when viewed along the thickness direction z. This contributes to the reduction of the dimensions of the semiconductor device A10 in the second direction y. Further, the second conductive member 42 overlaps the first conductive member 41 when viewed along the thickness direction z. As a result, mutual inductance caused by the first conductive member 41 and the second conductive member 42 is generated in the semiconductor device A10. Due to the mutual inductance, the inductance applied to the first conductive member 41 is reduced. Therefore, power loss from the first semiconductor element 21 to the second wiring layer 12 can be suppressed.

The semiconductor device A10 further includes the sealing resin 60. The sealing resin 60 covers the first wiring layer 11, the second wiring layer 12, the first semiconductor element 21, the second semiconductor element 22, the first conductive member 41 and the second conductive member 42, and a portion of the first terminal 31. As a result, the first terminal 31 is held in the sealing resin 60 while ensuring an insulation withstand voltage of the semiconductor device A10.

Both the third main surface 131 and the back surface 132 of the substrate 13 are in contact with the sealing resin 60. Thus, it is possible to prevent the substrate 13 from falling off from the sealing resin 60 in the thickness direction z. Further, the semiconductor device A10 includes the heat dissipation layer 16 bonded to the back surface 132. The heat dissipation layer 16 is exposed from the sealing resin 60. As a result, heat dissipation of the semiconductor device A10 can be improved.

The thickness of each of the first wiring layer 11 and the second wiring layer 12 is larger than the thickness of the substrate 13. As a result, in each of the first wiring layer 11 and the second wiring layer 12, heat conduction efficiency in the direction orthogonal to the thickness direction z can be improved. This contributes to improvement of heat dissipation of the semiconductor device A10.

Second Embodiment

Figure 13:
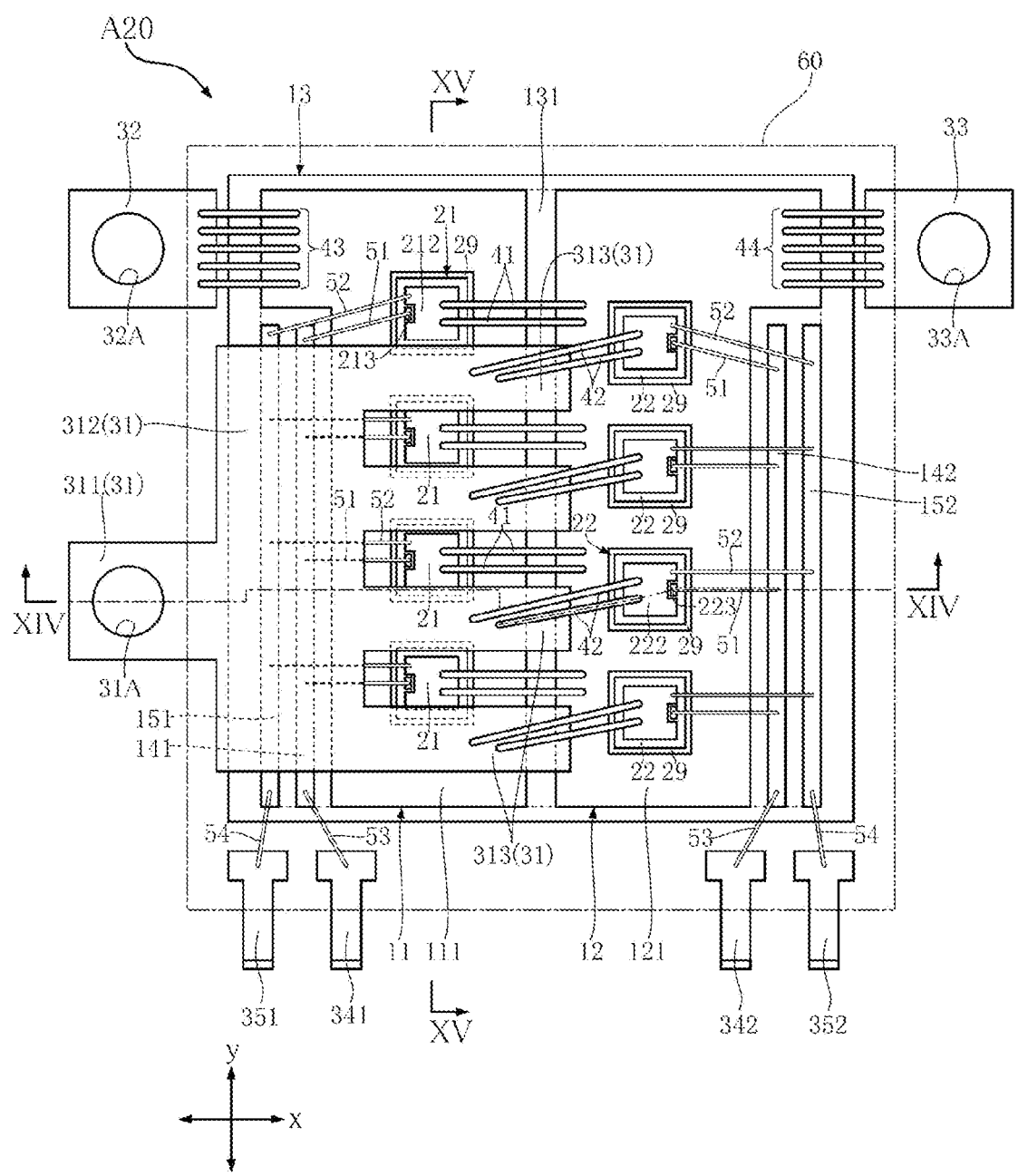
FIG. 13 is a plan view of a semiconductor device according to a second embodiment of the present disclosure, and is transparent to a sealing resin.
Figure 14:
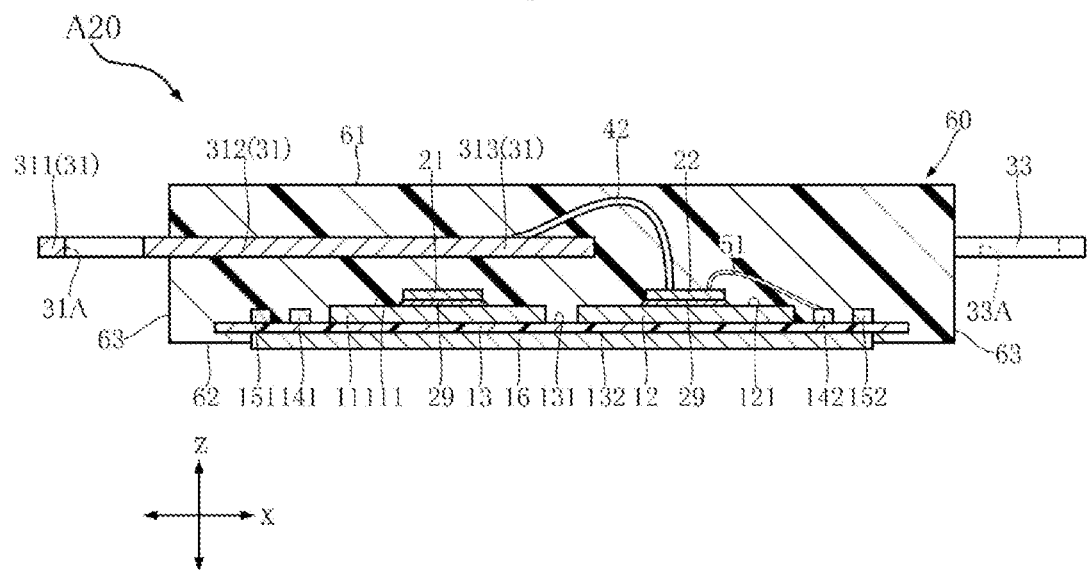
FIG. 14 is a cross-sectional view taken along line XIV-XIV in FIG. 13.
Figure 15:
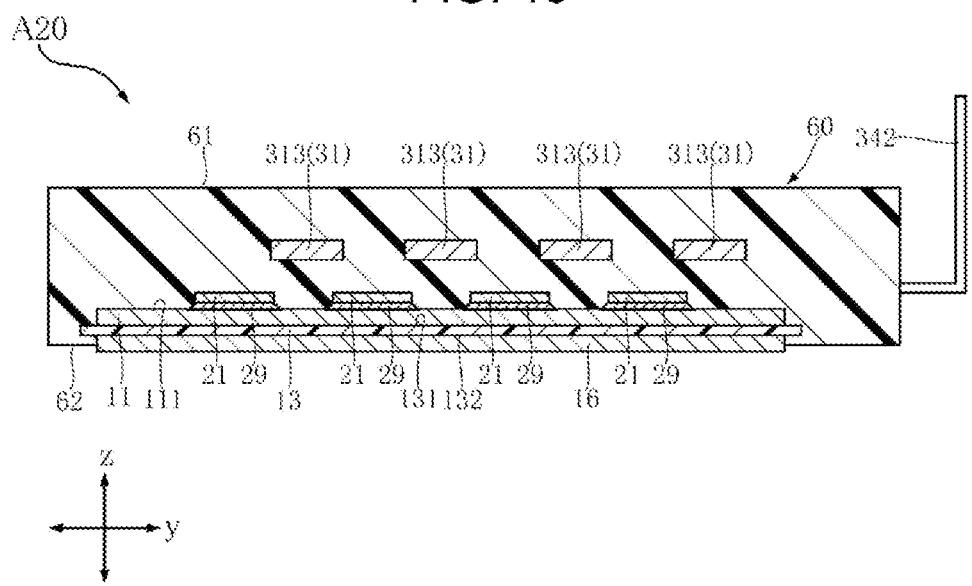
FIG. 15 is a cross-sectional view taken along line XV-XV in FIG. 13.

A semiconductor device A20 according to a second embodiment of the present disclosure will be described with reference to FIGS. 13 to 16. In these figures, elements that are the same as or similar to those of the above-described semiconductor device A10 are denoted by the same reference numerals, and redundant explanation thereof will be omitted. Here, FIG. 13 is transparent to the sealing resin 60 for the sake of convenience of understanding. In FIG. 13, the transparent sealing resin 60 is indicated by an imaginary line. In FIG. 13, line XIV-XIV is indicated by a one-dot chain line.

In the semiconductor device A20, the configurations of the first terminal 31, the plurality of second semiconductor elements 22, and the plurality of second conductive members 42 are different from those of the above-described semiconductor device A10.

As shown in FIGS. 13 to 16, in the semiconductor device A20, the first terminal 31 further has a plurality of extension portions 313. Each of the plurality of extension portions 313 is connected to the base portion 312 and is arranged along the second direction y. When viewed along the thickness direction z, each of the plurality of extension portions 313 extends from the base portion 312 toward any one of the plurality of second semiconductor elements 22 along the first direction x. The plurality of second conductive members 42 is individually bonded to the plurality of extension portions 313. In the semiconductor device A20, the base portion 312 and the plurality of extension portions 313 overlap the first wiring layer 11 when viewed along the thickness direction z. When viewed along the thickness direction z, the base portion 312 further overlaps the first gate wiring layer 141 and the first detection wiring layer 151.

Figure 16:
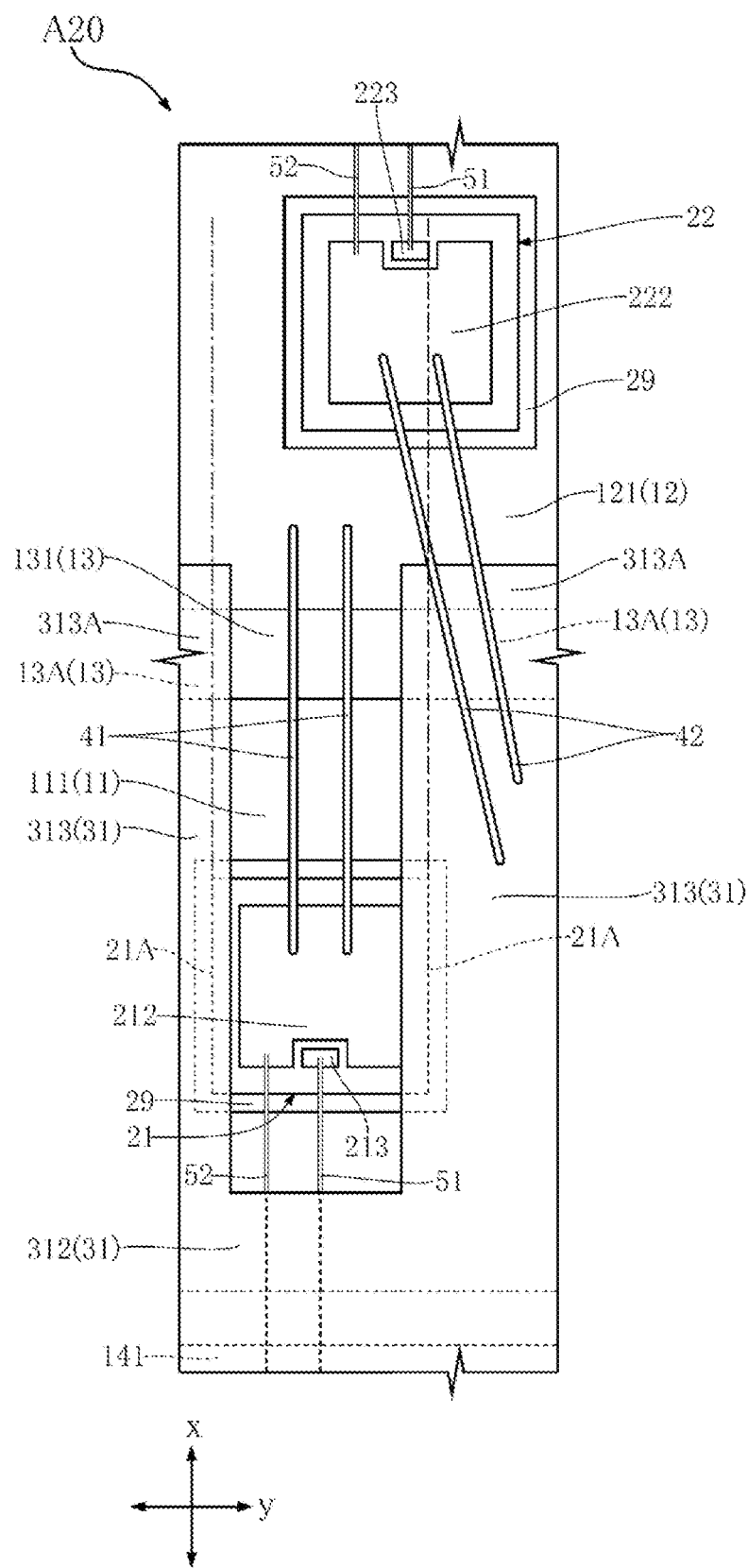
FIG. 16 is a partially enlarged view of FIG. 13.

As shown in FIG. 13, at least one of both ends of the plurality of extension portions 313 in the first direction x is located outside the first wiring layer 11. In the semiconductor device A20, one of both ends of each of the plurality of extension portions 313 in the first direction x, which is located away from the base portion 312, is located outside the first wiring layer 11. As shown in FIG. 16, the one end thereof is referred to as a tip 313A. When viewed along the thickness direction z, the tip 313A of each of the plurality of extension portions 313 overlaps a region 13A of the substrate 13 sandwiched between the first wiring layer 11 and the second wiring layer 12.

As shown in FIG. 16, each of the plurality of first semiconductor elements 21 further has a pair of edges 21A. When viewed along the thickness direction z, the paired edges 21A are located apart from each other in the second direction y and extend along the first direction x. When viewed along the thickness direction z, an extension line of any one of the paired edges 21A overlaps the second semiconductor element 22. As a result, the semiconductor device A20 has a configuration in which the plurality of first semiconductor elements 21 and the plurality of second semiconductor elements 22 are staggered in the second direction y.

As shown in FIG. 16, when viewed along the thickness direction z, each of the plurality of extension portions 313 of the first terminal 31 overlaps any one of the paired edges 21A of each of the plurality of first semiconductor elements 21. That is, each of the plurality of extension portions 313 overlaps any one of the plurality of first semiconductor elements 21.

As shown in FIG. 13, when viewed along the thickness direction z, each of the plurality of first conductive members 41 is located away from the plurality of extension portions 313 of the first terminal 31, and from the plurality of second conductive members 42. When viewed along the thickness direction z, each of the plurality of second conductive members 42 is inclined with respect to the first direction x.

Next, operative effects of the semiconductor device A20 will be described.

The semiconductor device A20 includes the first wiring layer 11 having the first main surface 111, the second wiring layer 12 having the second main surface 121, the first semiconductor element 21 having the first main surface electrode 212 and bonded to the first main surface 111, and the second semiconductor element 22 having the second main surface electrode 222 and bonded to the second main surface 121. Further, the semiconductor device A20 includes the first terminal 31 electrically connected the second main surface electrode 222, the first conductive member 41 bonded to the first main surface electrode 212 and the second main surface 121, and the second conductive member 42 bonded to the second main surface electrode 222 and the first terminal 31. The first terminal 31 is located away from the first wiring layer 11 on the side facing the first main surface 111 in the thickness direction z. The second conductive member 42 overlaps the first wiring layer 11 when viewed along the thickness direction z. Therefore, according to the semiconductor device A20, it is possible to reduce the size of the device.

In the semiconductor device A20, the first terminal 31 has the extension portion 313 that is connected to the base portion 312 and overlaps the first wiring layer 11 when viewed along the thickness direction z. The extension portion 313 extends along the first direction x toward the second semiconductor element 22 when viewed along the thickness direction z. The second conductive member 42 is bonded to the extension portion 313. As a result, the extension of the second conductive member 42 becomes smaller than that in the case of the semiconductor device A10. Further, by making a cross-sectional area of the extension portion 313 with respect to the first direction x larger than a cross-sectional area with respect to the extending direction of the second conductive member 42, it is possible to reduce a parasitic resistance of the semiconductor device A20. In addition, since the mutual inductance caused by the first wiring layer 11 and the first terminal 31 becomes larger, the inductance applied to the first wiring layer 11 is further reduced. Therefore, the power loss in the first wiring layer 11 can be suppressed more effectively.

When viewed along the thickness direction z, the tip 313A of the extension portion 313 of the first terminal 31 in the first direction x overlaps the region 13A of the substrate 13 sandwiched between the first wiring layer 11 and the second wiring layer 12 (see FIG. 16). As a result, in a manufacturing process of the semiconductor device A20, a spacer can be disposed in a space sandwiched between the region 13A of the substrate 13 and the tip 313A of the extension portion 313 in the thickness direction z. Therefore, when the second conductive member 42 is bonded to the extension portion 313, since displacement (deflection) of the extension portion 313 in the thickness direction z is reduced, a bonding strength of the second conductive member 42 to the extension portion 313 can be secured.

In the semiconductor device A20, the first semiconductor element 21 further has the pair of edges 21A. When viewed along the thickness direction z, the extension line of any one of the paired edges 21A overlaps the second semiconductor element 22. As a result, when viewed along the thickness direction z, the minimum distance between the extension portion 313 and the second semiconductor element 22 can be further reduced. As a result, the extension of the second conductive member 42 becomes smaller.

When viewed along the thickness direction z, the extension portion 313 of the first terminal 31 overlaps any one of the paired edges 21A of the first semiconductor element 21. As a result, it is possible to suppress expansion of the dimensions of the semiconductor device A20 in the first direction x due to the arrangement of the extension portion 313.

In the semiconductor device A20, when viewed along the thickness direction z, the first conductive member 41 is located away from the extension portion 313 and the second conductive member 42. As a result, in the manufacturing process of the semiconductor device A20, after the second conductive member 42 is bonded to the extension portion 313 of the first terminal 31, the first conductive member 41 can be bonded to the first main surface electrode 212 of the first semiconductor element 21 while preventing the first conductive member 41 from interfering with the second conductive member 42.

Third Embodiment

Figure 17:
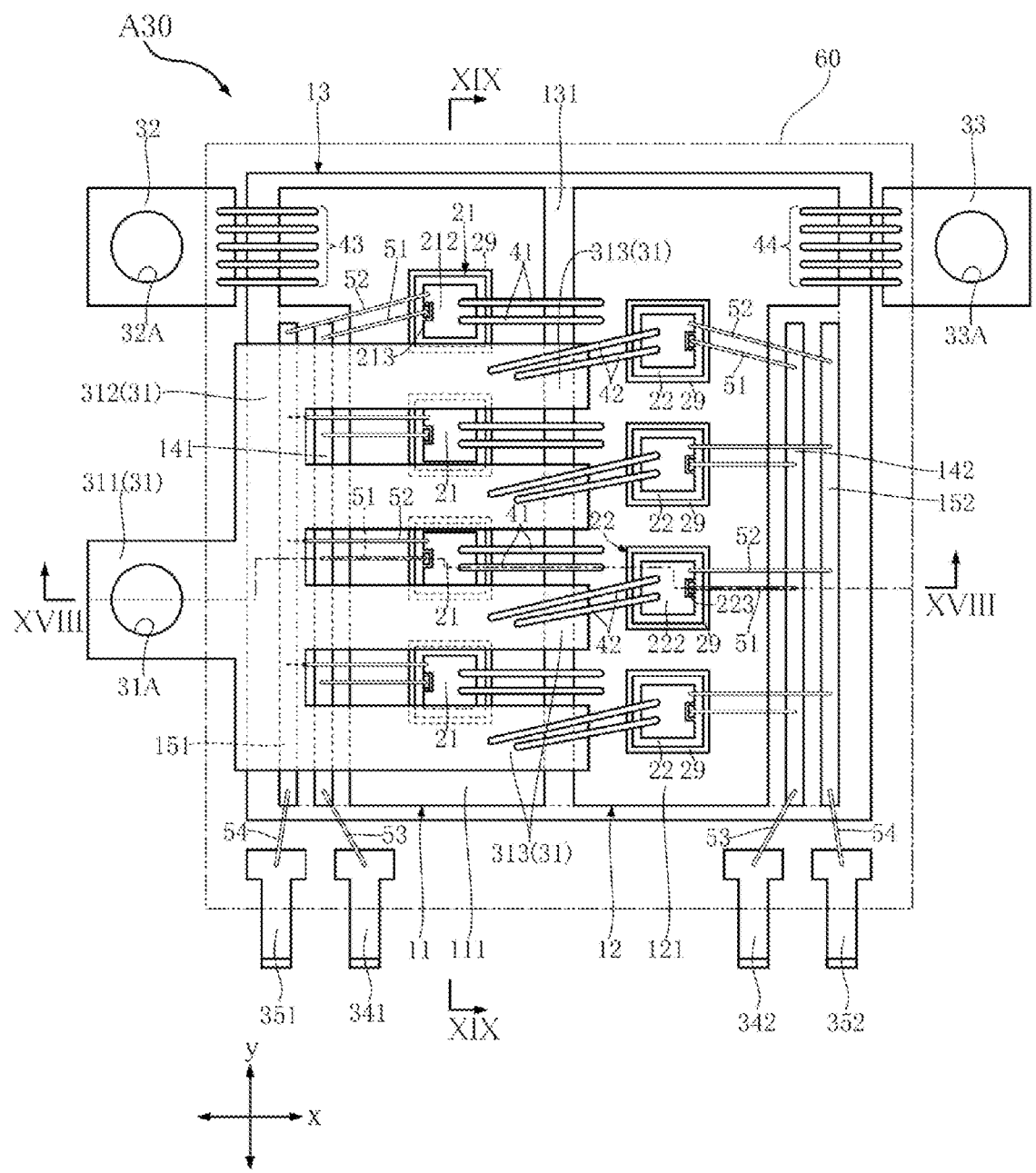
FIG. 17 is a plan view of a semiconductor device according to a third embodiment of the present disclosure, and is transparent to a sealing resin.
Figure 18:
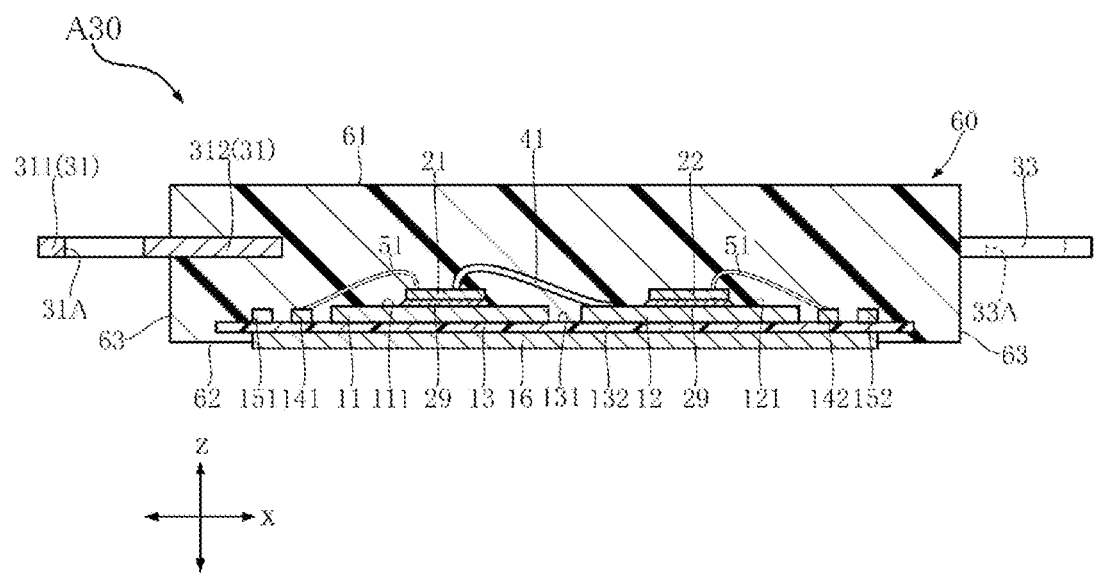
FIG. 18 is a cross-sectional view taken along line XVIII-XVIII in FIG. 17.
Figure 19:
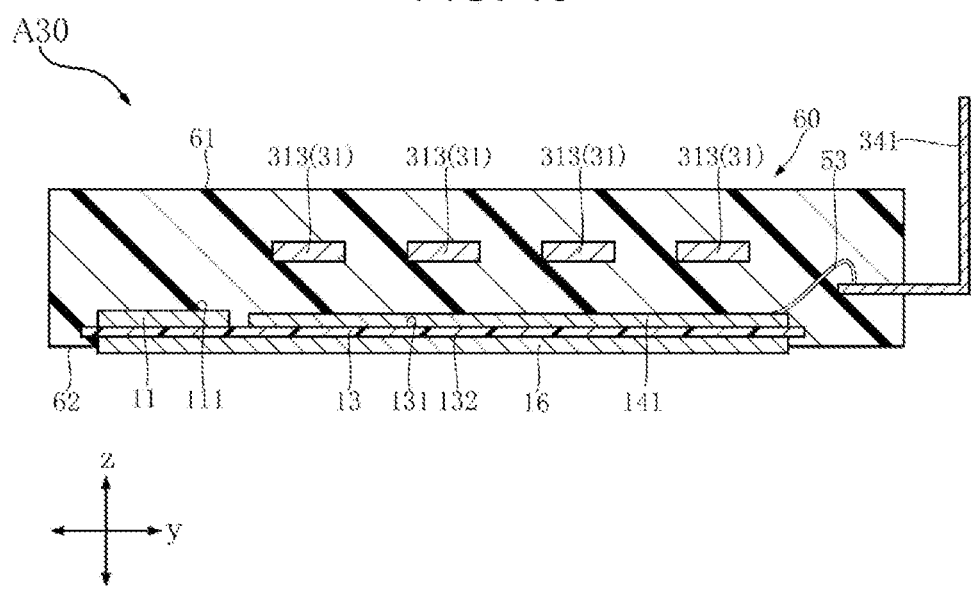
FIG. 19 is a cross-sectional view taken along line XIX-XIX.

A semiconductor device A30 according to a third embodiment of the present disclosure will be described with reference to FIGS. 17 to 19. In these figures, elements that are the same as or similar to those of the above-described semiconductor device A10 are denoted by the same reference numerals, and redundant explanation thereof will be omitted. Here, FIG. 17 is transparent to the sealing resin 60 for the sake of convenience of understanding. In FIG. 17, the transparent sealing resin 60 is indicated by an imaginary line. In FIG. 17, line XVIII-XVIII is indicated by a one-dot chain line.

In the semiconductor device A30, the configuration of the first terminal 31 is different from the configuration of the above-described semiconductor device A20.

As shown in FIG. 17, in the semiconductor device A30, both ends of each of the plurality of extension portions 313 of the first terminal 31 in the first direction x are located outside the first wiring layer 11. Therefore, in the semiconductor device A30, the plurality of extension portions 313 overlaps the first wiring layer 11 and the first gate wiring layer 141 when viewed along the thickness direction z (see FIG. 19). The base portion 312 overlaps the first detection wiring layer 151 when viewed along the thickness direction z (see FIG. 18).

Next, operative effects of the semiconductor device A30 will be described.

The semiconductor device A30 includes the first wiring layer 11 having the first main surface 111, the second wiring layer 12 having the second main surface 121, the first semiconductor element 21 having the first main surface electrode 212 and bonded to the first main surface 111, and the second semiconductor element 22 having the second main surface electrode 222 and bonded to the second main surface 121. Further, the semiconductor device A30 includes the first terminal 31 electrically connected to the second main surface electrode 222, the first conductive member 41 bonded to the first main surface electrode 212 and the second main surface 121, and the second conductive member 42 bonded to the second main surface electrode 222 and the first terminal 31. The first terminal 31 is located away from the first wiring layer 11 on the side facing the first main surface 111 in the thickness direction z. The second conductive member 42 overlaps the first wiring layer 11 when viewed along the thickness direction z. As a result, it is possible to reduce the size of the device.

In the semiconductor device A30, both ends of the extension portion 313 of the first terminal 31 in the first direction x are located outside the first wiring layer 11 when viewed along the thickness direction z. As a result, the gate wire 51 is located away from the first terminal 31 when viewed along the thickness direction z. Therefore, the minimum distance between the first wiring layer 11 and the first terminal 31 in the thickness direction z can be further reduced within a range in which the first terminal 31 does not come into contact with the first semiconductor element 21 and the detection wire 52. Therefore, the dimensions of the semiconductor device A30 in the thickness direction z can be reduced.

According to the present disclosure in some embodiments, it is possible to miniaturize a semiconductor device.

The present disclosure is not limited to the above-described embodiments. The specific configuration of each part of the present disclosure can be freely changed in design.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
    a first wiring layer having a first main surface facing a thickness direction;
    a second wiring layer having a second main surface facing a same side as the first main surface in the thickness direction and being located away from the first wiring layer in a first direction orthogonal to the thickness direction;
    a first semiconductor element having a first main surface electrode provided on a side facing the first main surface in the thickness direction, the first semiconductor element being bonded to the first main surface;
    a second semiconductor element having a second main surface electrode provided on a side facing the second main surface in the thickness direction, the second semiconductor element being bonded to the second main surface;
    a first terminal electrically connected to the second main surface electrode;
    a second terminal electrically connected to the first main surface electrode;
    a first conductive member bonded to the first main surface electrode and the second main surface; and
    a second conductive member bonded to the second main surface electrode and the first terminal;
    a third conductive member bonded to the second main surface and to the second terminal,
    wherein the first terminal is located away from the first wiring layer on the side facing the first main surface in the thickness direction,
    wherein the second terminal is located on a side opposite to the first wiring layer in the first direction with respect to the second semiconductor element, and is located away from the second wiring layer on the side facing the first main surface in the thickness direction,
    wherein the third conductive member includes a plurality of wires or a metal clip, and
    wherein the second conductive member overlaps the first wiring layer when viewed along the thickness direction.

2. The semiconductor device of claim 1, wherein the first terminal overlaps the first wiring layer when viewed along the thickness direction.

3. The semiconductor device of claim 2, further comprising:
    a substrate having a third main surface facing the same side as the first main surface and the second main surface in the thickness direction,
    wherein the first wiring layer and the second wiring layer are bonded to the third main surface.

4. The semiconductor device of claim 3, wherein a thickness of each of the first wiring layer and the second wiring layer is larger than a thickness of the substrate.

5. The semiconductor device of claim 3,
    wherein the first terminal has
        a terminal portion located outside the substrate when viewed along the thickness direction, and
        a base portion which is connected to the terminal portion and overlaps the substrate when viewed along the thickness direction, and
        wherein the base portion is located on a side opposite to the second wiring layer with respect to the first semiconductor element in the first direction.

6. The semiconductor device of claim 5,
    wherein the base portion overlaps the first wiring layer when viewed along the thickness direction,
    wherein the second conductive member is bonded to the base portion, and
    wherein the second conductive member overlaps the first semiconductor element when viewed along the thickness direction.

7. The semiconductor device of claim 6, wherein the second conductive member at least partially overlaps the first conductive member when viewed along the thickness direction.

8. The semiconductor device of claim 5,
    wherein the first terminal has an extension portion that is connected to the base portion and overlaps the first wiring layer when viewed along the thickness direction,
    wherein the extension portion extends along the first direction toward the second semiconductor element when viewed along the thickness direction, and
    wherein the second conductive member is bonded to the extension portion.

9. The semiconductor device of claim 8, wherein at least one of both ends of the extension portion in the first direction is located outside the first wiring layer when viewed along the thickness direction.

10. The semiconductor device of claim 9, wherein a tip of the extension portion in the first direction overlaps a region of the substrate sandwiched between the first wiring layer and the second wiring layer when viewed along the thickness direction.

11. The semiconductor device of claim 8,
wherein when viewed along the thickness direction, the first semiconductor element has a pair of edges, which are located apart from each other in a second direction orthogonal to both the thickness direction and the first direction and extend along the first direction, and
wherein an extension line of any one of the paired edges overlaps the second semiconductor element when viewed along the thickness direction.

12. The semiconductor device of claim 11, wherein the extension portion overlaps any one of the paired edges when viewed along the thickness direction.

13. The semiconductor device of claim 11, wherein the first conductive member is located away from the extension portion and the second conductive member when viewed along the thickness direction.

14. The semiconductor device of claim 5,
wherein the first semiconductor element has a first back surface electrode located on an opposite side to the first main surface electrode in the thickness direction and is electrically connected to the first wiring layer,
wherein the first back surface electrode is bonded to the first main surface,
wherein the second semiconductor element has a second back surface electrode located on an opposite side to the second main surface electrode in the thickness direction and is electrically connected to the second wiring layer, and
wherein the second back surface electrode is bonded to the second main surface.

15. The semiconductor device of claim 14, further comprising:
a third terminal electrically connected to the first wiring layer via a fourth conductive member,
wherein the third terminal is located away from the first terminal when viewed along the thickness direction, and
wherein both the terminal portion and the third terminal are located on one side in the first direction with respect to the first wiring layer and the third wiring layer.

16. The semiconductor device of claim 15, further comprising:
a sealing resin configured to cover the first wiring layer, the second wiring layer, the first semiconductor element, the second semiconductor element, the first conductive member and the second conductive member, and a portion of each of the first terminal and the second terminal,
wherein the third main surface is in contact with the sealing resin.

17. The semiconductor device of claim 16,
wherein the substrate has a substrate back surface facing a side opposite to the third main surface in the thickness direction,
wherein the semiconductor device further comprises a heat dissipation layer bonded to the substrate back surface and exposed to protrude from the sealing resin, and
wherein the substrate back surface is in contact with the sealing resin.

18. The semiconductor device of claim 16, further comprising:
control terminals electrically connected to a control electrode of the first semiconductor element and to a control electrode of the second semiconductor element, respectively,
wherein the sealing resin is configured to further cover a portion of the second terminal and a portion of each of the control terminals, and
wherein the portion of each of the control terminals is located to face the first main surface of the first wiring layer to be separated therefrom, and between the first wiring layer and the portion of each of the first terminal and the second terminal, in the thickness direction.

19. The semiconductor device of claim 18, wherein
the first semiconductor element and the second semiconductor element are both MISFETs formed on a semiconductor substrate including silicon carbide,
the first main surface electrode is a source electrode,
the control electrode is a gate electrode, and
a drain electrode is formed at a back surface of each of the first semiconductor element and the second semiconductor element.

20. The semiconductor device of claim 5,
wherein the second main surface electrode is electrically connected to the second wiring layer, and
wherein the second conductive member is electrically connected to the base portion.

* * * * *